US011027542B2

(12) United States Patent
Takagi

(10) Patent No.: US 11,027,542 B2
(45) Date of Patent: *Jun. 8, 2021

(54) DRIVING CIRCUIT, INTEGRATED CIRCUIT, AND LIQUID DISCHARGE APPARATUS

(71) Applicant: Seiko Epson Corporation, Tokyo (JP)

(72) Inventor: Tetsuo Takagi, Okaya (JP)

(73) Assignee: Seiko Epson Corporation

( * ) Notice: Subject to any disclaimer, the term of this patent is extended or adjusted under 35 U.S.C. 154(b) by 0 days.

This patent is subject to a terminal disclaimer.

(21) Appl. No.: 16/690,332

(22) Filed: Nov. 21, 2019

(65) Prior Publication Data

US 2020/0164637 A1 May 28, 2020

(30) Foreign Application Priority Data

Nov. 22, 2018 (JP) .............................. JP2018-219360

(51) Int. Cl.
| | |
|---|---|
| B41J 29/38 | (2006.01) |
| B41J 2/045 | (2006.01) |
| H02M 3/157 | (2006.01) |
| H02N 2/18 | (2006.01) |
| H02M 3/158 | (2006.01) |
| H01L 41/04 | (2006.01) |

(52) U.S. Cl.
CPC ....... *B41J 2/04541* (2013.01); *B41J 2/04581* (2013.01); *H01L 41/042* (2013.01); *H02M 3/157* (2013.01); *H02M 3/158* (2013.01); *H02N 2/181* (2013.01)

(58) Field of Classification Search
CPC .......................... B41J 2/04541; B41J 2/04593
See application file for complete search history.

(56) References Cited

U.S. PATENT DOCUMENTS

| | | | | |
|---|---|---|---|---|
| 5,980,015 | A | * | 11/1999 | Saruta ................. B41J 2/04541 347/11 |
| 7,537,299 | B2 | | 5/2009 | Tamura |

(Continued)

FOREIGN PATENT DOCUMENTS

JP          2017-043007 A          3/2017

OTHER PUBLICATIONS

U.S. Appl. No. 16/690,231, filed Nov. 21, 2019, Tetsuo Takagi.
U.S. Appl. No. 16/690,293, filed Nov. 21, 2019, Tetsuo Takagi.

*Primary Examiner* — Lam S Nguyen
(74) *Attorney, Agent, or Firm* — Harness, Dickey & Pierce, P.L.C.

(57) ABSTRACT

There is provided a driving circuit that drives a discharge head which includes a piezoelectric element, the driving circuit including: a first voltage signal output circuit that outputs the first voltage signal by operating based on an amplification control signal; and an integrated circuit that outputs the amplification control signal, in which the integrated circuit includes an amplification control signal generation circuit, an output control circuit, and a first register, in which the amplification control signal generation circuit generates the amplification control signal based on a drive data that defines a signal waveform of the first voltage signal input from an input terminal, in which the first register holds an operating state data that defines the operating state of the driving circuit input from the input terminal, and in which the output control circuit controls an output of the driving circuit based on the operating state data.

6 Claims, 15 Drawing Sheets

(56) References Cited

U.S. PATENT DOCUMENTS

| | | |
|---|---|---|
| 8,991,957 B2 | 3/2015 | Otokita |
| 9,669,621 B2 | 6/2017 | Nozawa |
| 2002/0036667 A1* | 3/2002 | Shingyohuchi ...... B41J 2/04593 347/11 |
| 2017/0057221 A1 | 3/2017 | Nozawa |

\* cited by examiner

|  |  | LARGE DOT | MEDIUM DOT | SMALL DOT | FINE VIBRATION |
|---|---|---|---|---|---|
| [SIH, SIL] | | [1, 1] | [1, 0] | [0, 1] | [0, 0] |
| S | T1 | H | H | L | L |
|  | T2 | H | L | H | L |
|  | T3 | L | L | L | H |

DRIVING CIRCUIT, INTEGRATED CIRCUIT, AND LIQUID DISCHARGE APPARATUS

The present application is based on, and claims priority from, JP Application Serial Number 2018-219360, filed Nov. 22, 2018, the disclosure of which is hereby incorporated by reference herein in its entirety.

BACKGROUND

1. Technical Field

The present disclosure relates to a driving circuit, an integrated circuit, and a liquid discharge apparatus.

2. Related Art

As a liquid discharge apparatus, such as an ink jet printer for discharging a liquid, such as an ink, to print an image or a document, a liquid discharge apparatus using a piezoelectric element is known. The piezoelectric element is provided in a print head corresponding to a plurality of nozzles for discharging the ink and a cavity for storing the ink discharged from the nozzles. Then, when the piezoelectric element is displaced in accordance with a driving signal, a diaphragm provided between the piezoelectric element and the cavity is bent, and a volume of the cavity is changed. Accordingly, a predetermined amount of ink is discharged from the nozzle at a predetermined timing, and dots are formed on a medium.

JP-A-2017-043007 discloses a liquid discharge apparatus that controls displacement of a voltage element and discharges an ink by supplying a driving signal generated based on printing data to an upper electrode, supplying a reference voltage to a lower electrode, and controlling whether to supply the driving signal by a switch circuit, such as a selection circuit, with respect to the piezoelectric element displaced based on a potential difference between the upper electrode and the lower electrode.

The liquid discharge apparatus as described in JP-A-2017-043007 has a plurality of operating states: a driving state where a piezoelectric element is driven based on a data signal supplied from a host computer or the like, and the ink is discharged; a standby state where the piezoelectric element is not driven and the ink is not discharged when the data signal is not supplied from the host computer or the like; a sleep state where power consumption is reduced more than that in the standby state immediately after the power is supplied to the liquid discharge apparatus or when the data signal is not supplied from the host computer or the like for a long period of time, and the like.

The operating states are transitioned by controlling the operation of the driving circuit that generates the driving signal for driving the piezoelectric element. The driving circuit includes an integrated circuit, and the operation is controlled by the integrated circuit. Therefore, in order to control the operating state of the driving circuit, it is necessary to control the operation of the integrated circuit. However, in order to control the operation of the integrated circuit included in the driving circuit, it is necessary to provide a terminal for inputting a command signal into the integrated circuit, and thus, there is a concern that the size of the integrated circuit increases.

SUMMARY

According to an aspect of the present disclosure, there is provided a driving circuit that drives a discharge head which includes a piezoelectric element driven by receiving a first voltage signal and which discharges a liquid by driving the piezoelectric element, the driving circuit including: a first voltage signal output circuit that outputs the first voltage signal by operating based on an amplification control signal; and an integrated circuit that outputs the amplification control signal, in which the integrated circuit includes an amplification control signal generation circuit, an output control circuit, and a first register, in which the amplification control signal generation circuit generates the amplification control signal based on drive data that defines a signal waveform of the first voltage signal input from an input terminal, in which the first register holds operating state data that defines the operating state of the driving circuit input from the input terminal, and in which the output control circuit controls an output of the driving circuit based on the operating state data.

In the driving circuit, the integrated circuit may include a second register that holds abnormality detection data for determining the presence or absence of an abnormality in the operating state data held by the first register, and the second register may be provided at the same address as the first register.

In the driving circuit, the integrated circuit may control the supply of the first voltage signal to the piezoelectric element based on the operating state data held by the first register.

In the driving circuit, a switch circuit of which one end is supplied with the first voltage signal and the other end is electrically connected to the piezoelectric element, may further be provided, and the integrated circuit may control supply of power source voltage to the switch circuit based on the operating state data held by the first register.

In the driving circuit, the piezoelectric element may be driven by a potential difference between a first electrode to which the first voltage signal is supplied and a second electrode to which a second voltage signal is supplied, and the integrated circuit may control the supply of the second voltage signal to the second electrode based on the operating state data held by the first register.

According to another aspect of the present disclosure, there is provided an integrated circuit including a driving circuit that drives a discharge head which includes a piezoelectric element driven by receiving a first voltage signal and which discharges a liquid by driving the piezoelectric element, the integrated circuit including: an amplification control signal generation circuit; an output control circuit; and a first register, in which the amplification control signal generation circuit generates an amplification control signal which is a basis of the first voltage signal based on drive data that defines a signal waveform of the first voltage signal input from an input terminal, in which the first register holds operating state data input from the input terminal, and in which the output control circuit controls an output of the driving circuit based on the operating state data.

According to still another aspect of the disclosure, there is provided a liquid discharge apparatus including: a discharge head that includes a piezoelectric element driven by receiving a first voltage signal and that discharges a liquid by driving the piezoelectric element; and a driving circuit for driving the discharge head, in which the driving circuit includes a first voltage signal output circuit that outputs the first voltage signal by operating based on an amplification control signal, and an integrated circuit that outputs the amplification control signal, in which the integrated circuit includes an amplification control signal generation circuit, an output control circuit, and a first register, in which the amplification control signal generation circuit generates the amplification control signal based on drive data that defines a signal waveform of the first voltage signal input from an input terminal, in which the first register holds operating state data that defines the operating state of the driving circuit input from the input terminal, and in which the output control circuit controls an output of the driving circuit based on the operating state data.

DESCRIPTION OF EXEMPLARY EMBODIMENTS

Figure 1:
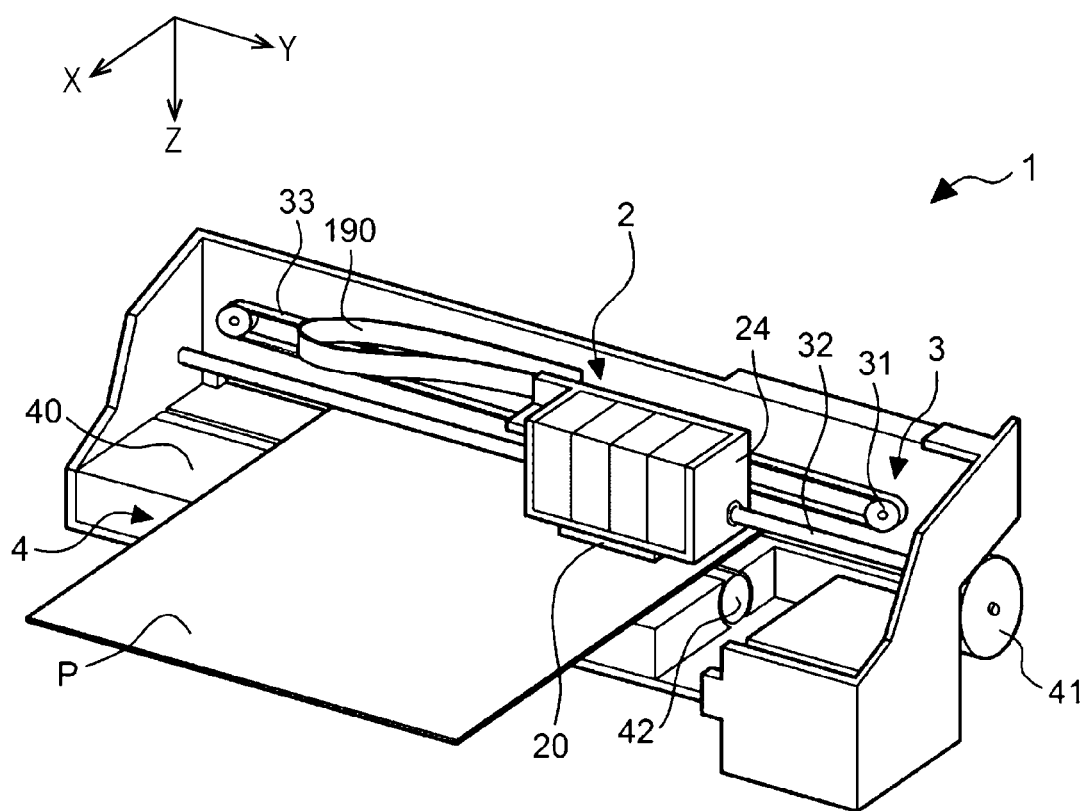
FIG. 1 is a perspective view illustrating a schematic configuration of a liquid discharge apparatus.

Hereinafter, appropriate embodiments of the disclosure will be described with reference to the drawings. The drawing to be used is for convenience of description. In addition, the embodiments which will be described below do not inappropriately limit the contents of the disclosure described in the claims. In addition, not all of the configurations which will be described below are necessarily essential components of the disclosure.

1. Configuration of Liquid Discharge Apparatus

A printing apparatus as an example of a liquid discharge apparatus according to the embodiment is an ink jet printer that forms a dot on a printing medium, such as a paper sheet, by discharging an ink corresponding to image data supplied from an external host computer, and accordingly, prints an image (including letters, figures, and the like) that corresponds to the image data.

FIG. 1 is a perspective view illustrating a schematic configuration of a liquid discharge apparatus 1. FIG. 1 illustrates a direction X in which a medium P is transported, a direction Y which intersects with the direction X and in which a moving object 2 reciprocates, and a direction Z in which the ink is discharged. In the embodiment, the directions X, Y, and Z will be described as axes orthogonal to each other.

As illustrated in FIG. 1, the liquid discharge apparatus 1 includes the moving object 2 and a moving mechanism 3 that causes the moving object 2 to reciprocate along the direction Y. The moving mechanism 3 includes a carriage motor 31 as a driving source of the moving object 2, a carriage guide shaft 32 of which both ends are fixed, and a timing belt 33 which extends substantially parallel to the carriage guide shaft 32 and is driven by the carriage motor 31.

The carriage 24 included in the moving object 2 is supported to be freely reciprocable by the carriage guide shaft 32 and fixed to a part of the timing belt 33. In addition, by driving the timing belt 33 by the carriage motor 31, the moving object 2 is guided by the carriage guide shaft 32 and reciprocates along the direction Y. Further, at a part that faces the medium P in the moving object 2, a head unit 20 having multiple nozzles is provided. Control signals and the like are supplied to the head unit 20 via a cable 190. In addition, the head unit 20 discharges the ink as an example of the liquid from the nozzles based on the supplied control signal.

The liquid discharge apparatus 1 includes a transport mechanism 4 that transports the medium P along the direction X on a platen 40. The transport mechanism 4 includes a transport motor 41 which is a driving source, and a transport roller 42 which is rotated by the transport motor 41 and transports the medium P along the direction X. Then, at the timing when the medium P is transported by the transport mechanism 4, the head unit 20 discharges the ink, and accordingly, an image is formed on a surface of the medium P.

Figure 2:
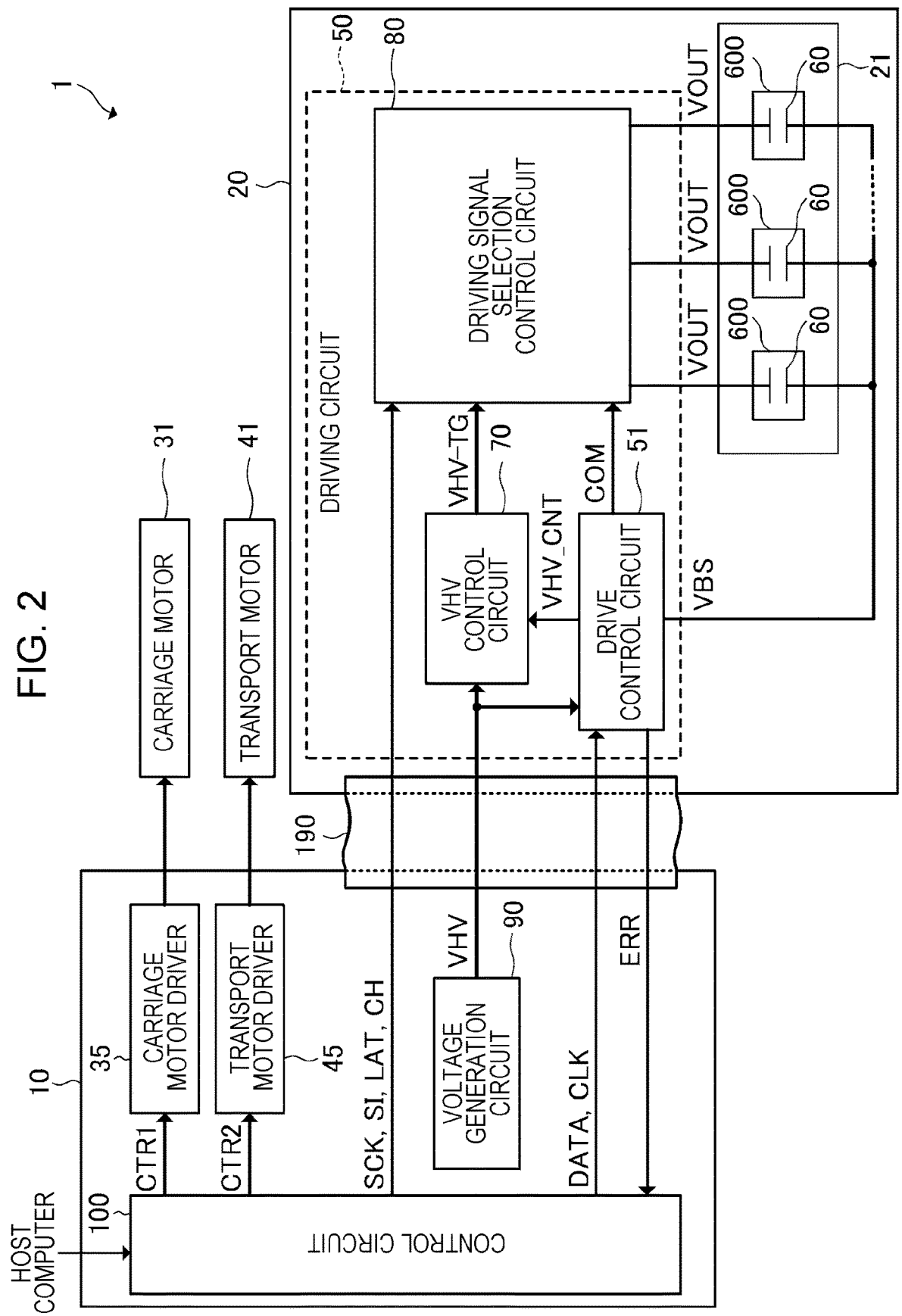
FIG. 2 is a block diagram illustrating an electric configuration of the liquid discharge apparatus.

FIG. 2 is a block diagram illustrating an electric configuration of the liquid discharge apparatus 1. As illustrated in FIG. 2, the liquid discharge apparatus 1 has a control section 10 and the head unit 20. The control section 10 and the head unit 20 are electrically connected by a cable 190, such as a flexible flat cable (FFC).

The control section 10 includes a control circuit 100, a carriage motor driver 35, a transport motor driver 45, and a voltage generation circuit 90. Then, the control circuit 100 supplies a plurality of control signals and the like for controlling various components based on the image data supplied from the host computer.

Specifically, the control circuit 100 supplies a control signal CTR1 to the carriage motor driver 35. The carriage motor driver 35 drives the carriage motor 31 in accordance with the control signal CTR1. Accordingly, the movement of the carriage 24 illustrated in FIG. 1 in the direction Y is controlled. In addition, the control circuit 100 supplies a control signal CTR2 to the transport motor driver 45. The transport motor driver 45 drives the transport motor 41 in accordance with the control signal CTR2. Accordingly, the movement of the medium P by the transport mechanism 4 illustrated in FIG. 1 in the direction X is controlled.

Further, the control circuit 100 supplies the head unit 20 with two clock signals SCK and CLK, a print data signal SI, a latch signal LAT, a change signal CH, and a drive data signal DATA.

The voltage generation circuit 90 generates, for example, a voltage VHV having DC of 42 V. Then, the voltage generation circuit 90 supplies the voltage VHV to various components included in the control section 10 and the head unit 20.

The head unit 20 includes a discharge head 21 and a driving circuit 50 that drives the discharge head 21. Further, the driving circuit 50 includes a drive control circuit 51, a VHV control circuit 70, and a driving signal selection control circuit 80.

The drive control circuit 51 is supplied with the voltage VHV, the drive data signal DATA, and the clock signal CLK. The drive control circuit 51 generates a driving signal COM by D class amplification of a signal based on the drive data signal DATA, and supplies the generated driving signal COM to the driving signal selection control circuit 80. Further, the drive control circuit 51 generates, for example, a reference voltage signal VBS having DC of 5 V obtained by stepping down the voltage VHV and supplies the generated reference voltage signal VBS to the discharge head 21. Further, the drive control circuit 51 generates a VHV control signal VHV_CNT based on the drive data signal DATA and supplies the generated VHV control signal VHV_CNT to the VHV control circuit 70. When an abnormality occurs in the drive control circuit 51, the drive control circuit 51 generates an error signal ERR indicating the abnormality and outputs the error signal ERR to the control circuit 100.

The VHV control circuit 70 is supplied with the voltage VHV and the VHV control signals VHV_CNT. The VHV control circuit 70 switches the potential of a voltage VHV-TG supplied to the driving signal selection control circuit 80 to the voltage VHV or to the potential of the ground in accordance with the VHV control signal VHV_CNT.

The driving signal selection control circuit 80 is supplied with the clock signal SCK, the print data signal SI, the latch signal LAT, the change signal CH, the voltage VHV-TG, and the driving signal COM. The driving signal selection control circuit 80 switches selection and deselection of the driving signal COM based on the clock signal SCK, the print data signal SI, the latch signal LAT, and the change signal CH, and outputs selection or deselection as a driving signal VOUT to the discharge head 21.

The discharge head 21 includes a plurality of discharge sections 600 including a piezoelectric element 60, and is supplied with the driving signal VOUT and the reference voltage signal VBS. The driving signal VOUT is supplied to one end of the piezoelectric element 60, and the reference voltage signal VBS is supplied to the other end of the piezoelectric element 60. The piezoelectric element 60 is driven corresponding to a potential difference between the driving signal VOUT and the reference voltage signal VBS. Then, the discharge section 600 discharges an amount of ink that corresponds to the displacement.

In addition, the details of the driving circuit 50 and the discharge head 21 described above will be described later. In addition, although the liquid discharge apparatus 1 is described as an apparatus including one head unit 20 in FIG. 2, a plurality of head units 20 may be provided, and the head unit 20 may be provided with the plurality of discharge heads 21.

2. Configuration and Operation of Driving Signal Selection Control Circuit

Next, the configuration and operation of the driving signal selection control circuit 80 will be described. First, an example of the driving signal COM supplied to the driving signal selection control circuit 80 will be described with reference to FIG. 3. Thereafter, the configuration and operation of the driving signal selection control circuit 80 will be described with reference to FIGS. 4 to 7.

Figure 3:
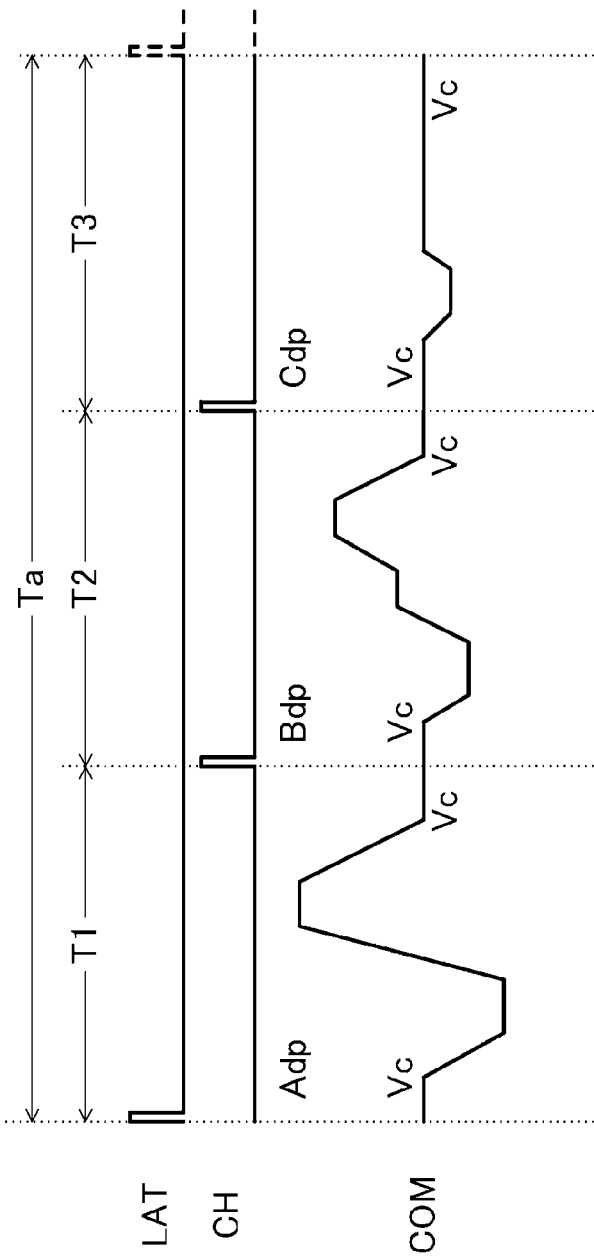
FIG. 3 is a view illustrating an example of a driving signal.

FIG. 3 is a view illustrating an example of the driving signal COM. FIG. 3 illustrates a period T1 from the rise of the latch signal LAT to the rise of the change signal CH, a period T2 after the period T1 to the next rise of the change signal CH, and a period T3 after the period T2 to the rise of the latch signal LAT. In addition, a cycle configured with the periods T1, T2, and T3 is a cycle Ta for forming new dots on the medium P.

As illustrated in FIG. 3, the drive control circuit 51 generates a voltage waveform Adp in the period T1. When the voltage waveform Adp is supplied to the piezoelectric element 60, a predetermined amount, specifically, a medium amount of ink is discharged from the corresponding discharge section 600. Further, the drive control circuit 51 generates a voltage waveform Bdp in the period T2. When the voltage waveform Bdp is supplied to the piezoelectric element 60, a small amount of ink smaller than the predetermined amount is discharged from the corresponding discharge section 600. Further, the drive control circuit 51 generates a voltage waveform Cdp in the period T3. When the voltage waveform Cdp is supplied to the piezoelectric element 60, the piezoelectric element 60 is displaced to such an extent that the ink is not discharged from the corresponding discharge section 600. Therefore, dots are not formed on the medium P. The voltage waveform Cdp is a voltage waveform for preventing the increase in the ink viscosity by finely vibrating the ink in the vicinity of a nozzle opening portion of the discharge section 600. In the following description, in order to prevent the increase in the ink viscosity, displacing the piezoelectric element 60 to such an extent that the ink is not discharged from the discharge section 600 is referred to as "fine vibration".

Here, the voltage value at the start timing and the voltage value at the end timing of the voltage waveform Adp, the voltage waveform Bdp, and the voltage waveform Cdp are all common to a voltage Vc. In other words, the voltage waveforms Adp, Bdp, and Cdp are voltage waveforms that start at the voltage Vc and end at the voltage Vc. Therefore, the drive control circuit 51 outputs the driving signal COM of the voltage waveform in which the voltage waveforms Adp, Bdp, and Cdp are continuous in the cycle Ta.

Then, the voltage waveforms Adp and Bdp are supplied to the piezoelectric element 60 in the periods T1 and T2, and the voltage waveform Cdp is not supplied in the period T3, and thus, the medium amount of ink and small amount of ink are discharged from the discharge section 600 in the cycle Ta. Accordingly, "large dots" are formed on the medium P. Then, the voltage waveform Adp is supplied to the piezoelectric element 60 in the period T1, and the voltage waveforms Bdp and Cdp are not supplied in the periods T2 and T3, and thus, the medium amount of ink is discharged from the discharge section 600 in the cycle Ta. Accordingly, "medium dots" are formed on the medium P. Then, the voltage waveforms Adp and Cdp are not supplied to the piezoelectric element 60 in the periods T1 and T3, and the voltage waveform Bdp is supplied in the period T2, and thus, the small amount of ink is discharged from the discharge section 600 in the cycle Ta. Accordingly, "small dots" are formed on the medium P. Then, the voltage waveforms Adp and Bdp are not supplied to the piezoelectric element 60 in the periods T1 and T2, and the voltage waveform Cdp is supplied in the period T3, and thus, the ink is not discharged from the discharge section 600 in the cycle Ta, and finely vibrates. In this case, dots are not formed on the medium P.

Figure 4:
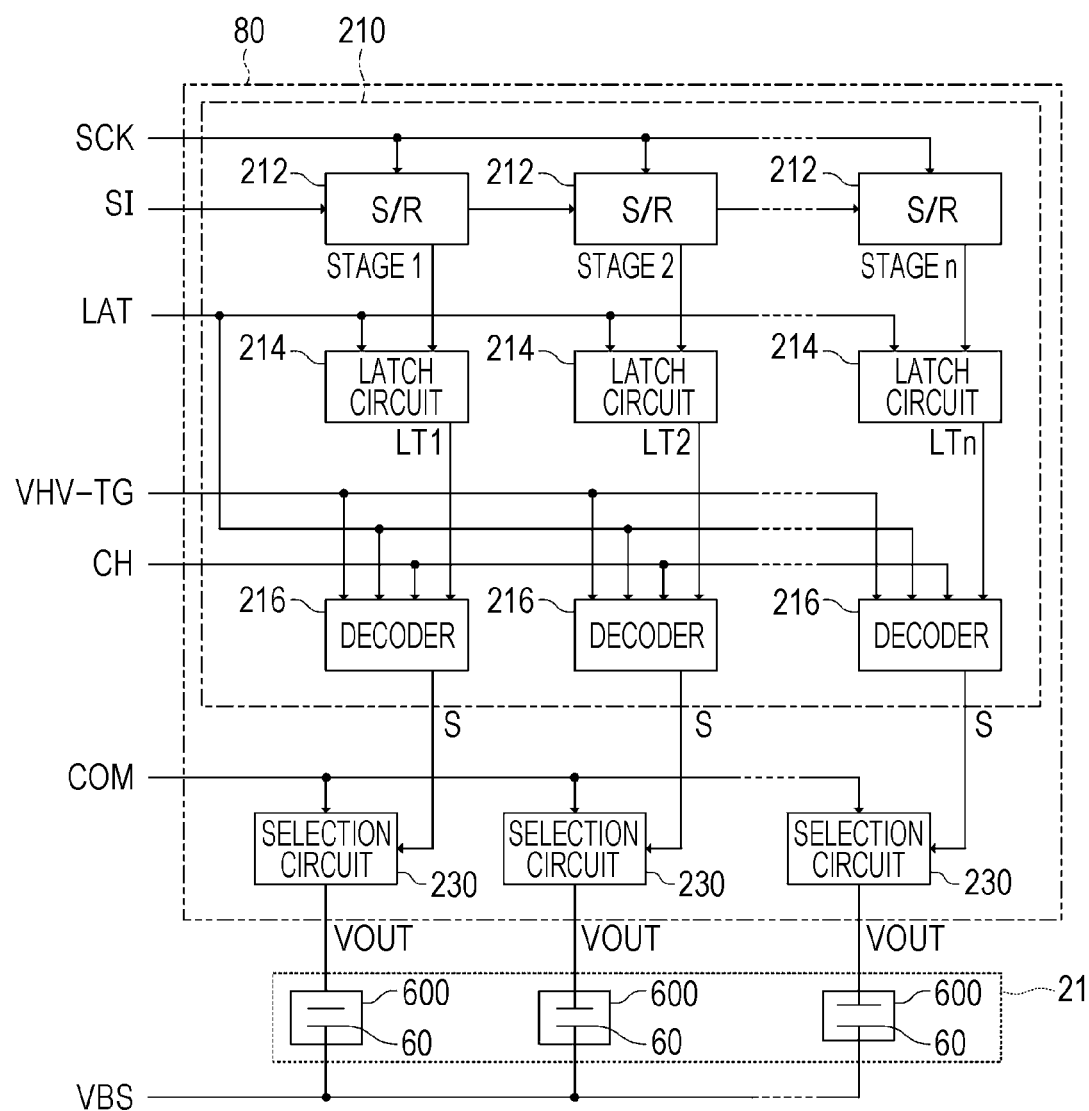
FIG. 4 is a block diagram illustrating an electric configuration of a driving signal selection control circuit.

FIG. 4 is a block diagram illustrating an electric configuration of the driving signal selection control circuit 80. The driving signal selection control circuit 80 generates and outputs the driving signal VOUT in the cycle Ta by switching selection and deselection of the voltage waveforms Adp, Bdp, and Cdp included in the driving signal COM in each of the periods T1, T2, and T3. As illustrated in FIG. 4, the driving signal selection control circuit 80 includes a selection control circuit 210 and a plurality of selection circuits 230.

The selection control circuit 210 is supplied with the clock signal SCK, the print data signal SI, the latch signal LAT, the change signal CH, and the voltage VHV-TG. In the selection control circuit 210, sets of a shift register 212 (S/R), a latch circuit 214, and a decoder 216 are provided corresponding to each of the discharge sections 600. In other words, the head unit 20 is provided with sets of the shift register 212, the latch circuit 214, and the decoder 216 as many as the total number n of the discharge sections 600.

The shift register 212 temporarily holds 2-bit print data [SIH, SIL] included in the print data signal SI for each corresponding discharge section 600. Specifically, the shift register 212 having the number of stages that corresponds to the discharge section 600 is continuously connected to each other, and the print data signal SI which is serially supplied is sequentially transferred to the subsequent stage in accordance with the clock signal SCK. In addition, in FIG. 4, in order to distinguish the shift register 212, the shift register 212 is denoted as stage 1, stage 2, . . . , stage n in order from the upstream side to which the print data signal SI is supplied.

Each of the n latch circuits 214 latches the print data [SIH, SIL] held by the corresponding shift register 212 at the rise of the latch signal LAT. Each of the n decoders 216 decodes the 2-bit print data [SIH, SIL] latched by the corresponding latch circuit 214 to generate a selection signal S, and supplies the generated selection signal S to the selection circuit 230.

The selection circuit 230 is provided corresponding to each of the discharge sections 600. In other words, the number of selection circuits 230 included in one head unit 20 is the same as the total number n of the discharge sections 600 included in the head unit 20. The selection circuit 230 controls the supply of the driving signal COM to the piezoelectric element 60 based on the selection signal S supplied from the decoder 216.

Figures 5, 6:
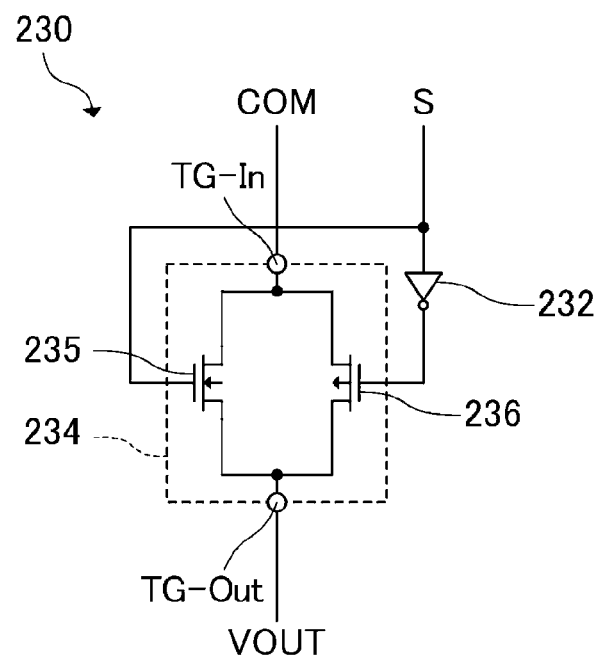
FIG. 5 is a circuit diagram illustrating an electric configuration of a selection circuit.
FIG. 6 is a view illustrating decoding contents in a decoder.

FIG. 5 is a circuit diagram illustrating an electric configuration of the selection circuit 230 that corresponds to one discharge section 600. As illustrated in FIG. 5, the selection circuit 230 includes an inverter 232 and a transfer gate 234. In addition, the transfer gate 234 includes a transistor 235 which is an NMOS transistor and a transistor 236 which is a PMOS transistor.

The selection signal S is supplied from the decoder 216 to a gate terminal of the transistor 235. The selection signal S is also logically inverted by the inverter 232 and also supplied to the gate terminal of the transistor 236. A drain terminal of the transistor 235 and a source terminal of the transistor 236 are connected to a terminal TG-In which is one end. The driving signal COM is input from the terminal TG-In. Then, the transistor 235 and the transistor 236 are controlled to be turned on or off in accordance with the selection signal S, and accordingly, the driving signal VOUT is output from a terminal TG-Out which is the other end to which the source terminal of the transistor 235 and the drain terminal of the transistor 236 are commonly connected. The terminal TG-Out is electrically connected to a first electrode 611 (will be described later) of the piezoelectric element 60. In the following description, a case where the transistor 235 and the transistor 236 are controlled to the conductive state may be referred to as an on state, and a case where the transistor 235 and the transistor 236 are controlled to the non-conductive state may be referred to as an off state. Here, the transfer gate 234 is an example of a switch circuit.

Next, the decoding contents of the decoder 216 will be described using FIG. 6. FIG. 6 is a view illustrating the decoding contents in the decoder 216. The decoder 216 receives the 2-bit print data [SIH, SIL], the latch signal LAT, and the change signal CH.

The decoder 216 outputs the selection signal S which becomes H, H, and L levels in the periods T1, T2, and T3 when the print data [SIH, SIL] is [1, 1] defining "large dot". Further, the decoder 216 outputs the selection signal S which becomes H, L, and L levels in the periods T1, T2, and T3 when the print data [SIH, SIL] is [1, 0] defining "medium dot". In addition, the decoder 216 outputs the selection signal S which becomes L, H, and L levels in the periods T1, T2, and T3 when the print data [SIH, SIL] is [0, 1] defining "small dot". Further, the decoder 216 outputs the selection signal S which becomes L, L, and H levels in the periods T1, T2, and T3 when the print data [SIH, SIL] is [0, 0] defining "fine vibration". Here, a logic level of the selection signal S is level-shifted to a high amplitude logic based on the voltage VHV-TG by a level shifter (not illustrated).

The operation of generating the driving signal VOUT based on the driving signal COM and supplying the generated driving signal VOUT to the discharge section 600 included in the discharge head 21 in the driving signal selection control circuit 80 described above will be described with reference to FIG. 7.

Figure 7:
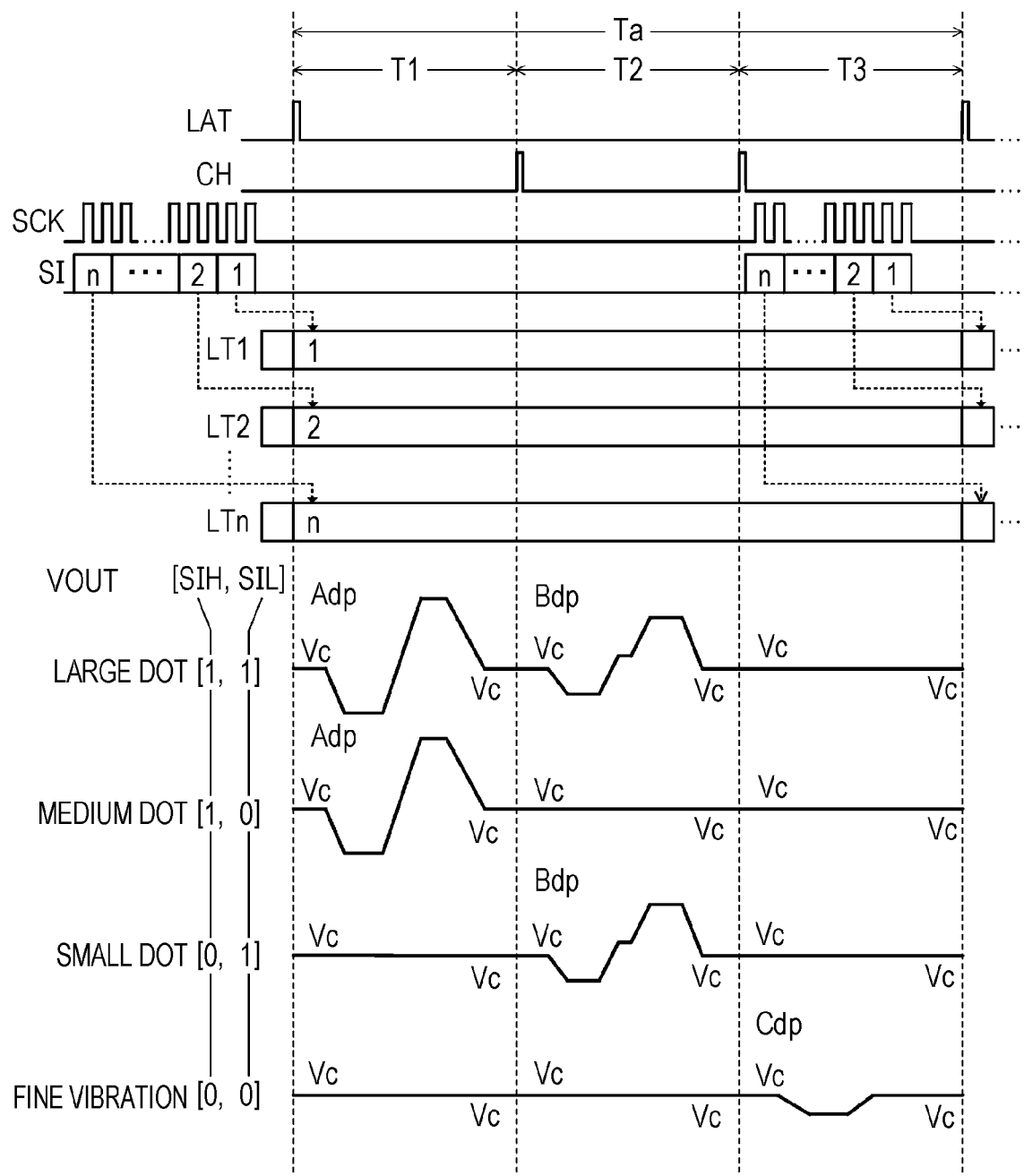
FIG. 7 is a view for describing an operation of a selection control circuit.

FIG. 7 is a view for describing the operation of the driving signal selection control circuit 80. As illustrated in FIG. 7, the print data signal SI is serially supplied in synchronization with the clock signal SCK to the driving signal selection control circuit 80, and sequentially transferred in the shift register 212 that corresponds to the discharge section 600. Then, when the supply of the clock signal SCK is stopped, the print data [SIH, SIL] that corresponds to the discharge section 600 is held by each of the shift registers 212. Further, the print data signal SI is supplied in order that corresponds to the discharge section 600 on the last stage n, . . . , stage 2, and stage 1 in the shift register 212.

Here, when the latch signal LAT rises, each of the latch circuits 214 latches the print data [SIH, SIL] held by the corresponding shift register 212 all at once. In FIG. 7, LT1, LT2, . . . , and LTn indicate the print data [SIH, SIL] latched by the latch circuit 214 that corresponds to the shift register 212 on stage 1, stage 2, . . . , and stage n.

The decoder 216 outputs the selection signal S of the logic level in accordance with the contents illustrated in FIG. 6 in each of the periods T1, T2, and T3 corresponding to the size of the dot defined by the latched print data [SIH, SIL].

When the print data [SIH, SIL] is [1, 1], the selection circuit 230 selects the voltage waveform Adp, selects the voltage waveform Bdp in the period T2, and does not select the voltage waveform Cdp in the period T3, in the period T1, in accordance with the selection signal S. As a result, the driving signal VOUT that corresponds to the large dot illustrated in FIG. 7 is generated. In addition, when the print data [SIH, SIL] is [1, 0], the selection circuit 230 selects the voltage waveform Adp in the period T1, does not select the voltage waveform Bdp in the period T2, and does not select the voltage waveform Cdp in the period T3, in accordance with the selection signal S. As a result, the driving signal VOUT that corresponds to the medium dot illustrated in FIG. 7 is generated. In addition, when the print data [SIH, SIL] is [0, 1], the selection circuit 230 does not select the voltage waveform Adp in the period T1, selects the voltage waveform Bdp in the period T2, and does not select the voltage waveform Cdp in the period T3, in accordance with the selection signal S. As a result, the driving signal VOUT that corresponds to the small dot illustrated in FIG. 7 is generated. In addition, when the print data [SIH, SIL] is [0, 0], the selection circuit 230 does not select the voltage waveform Adp in the period T1, selects the voltage waveform Bdp in the period T2, and does not select the voltage waveform Cdp in the period T3, in accordance with the selection signal S. As a result, the driving signal VOUT that corresponds to the fine vibration illustrated in FIG. 7 is generated.

Here, the driving signal COM is an example of a first voltage signal. In addition, the driving signal VOUT generated by selecting or deselecting the voltage waveforms Adp, Bdp, and Cdp included in the driving signal COM is also an example of the first voltage signal.

3. Configuration and Operation of Discharge Section

Figure 8:
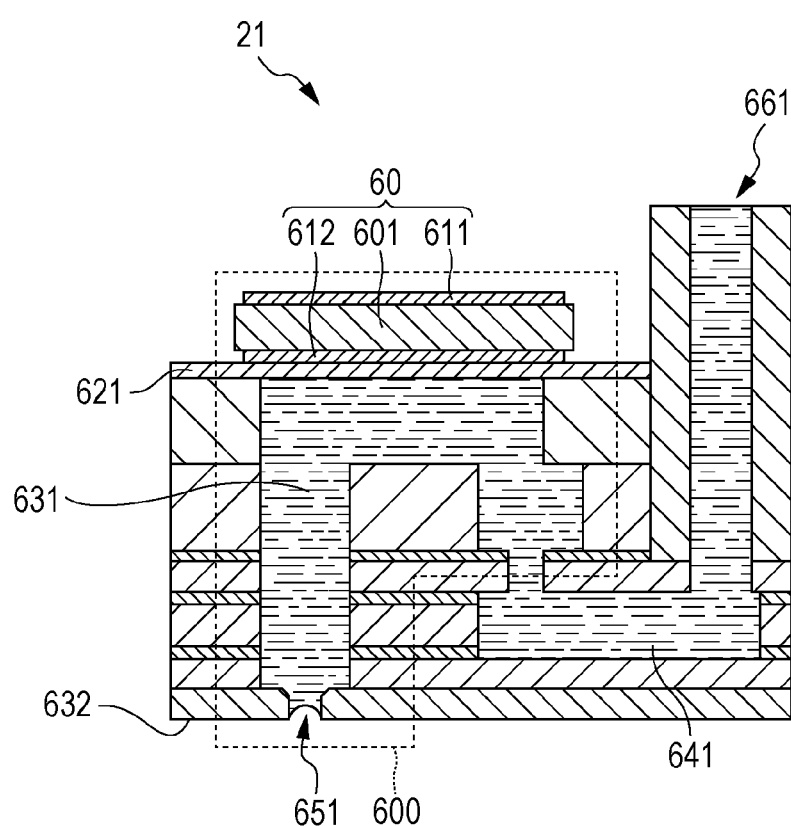
FIG. 8 is a sectional view illustrating a schematic configuration of a discharge section.

Next, the configuration and operation of the discharge section 600 included in the discharge head 21 will be described. FIG. 8 is a sectional view illustrating a schematic configuration of the discharge section 600 in which the discharge head 21 is cut to include the discharge section 600. As illustrated in FIG. 8, the discharge head 21 includes the discharge section 600 and a reservoir 641.

The ink is introduced into the reservoir 641 from a supply port 661. Further, the reservoirs 641 are provided for each color of ink.

The discharge section 600 includes the piezoelectric element 60, a diaphragm 621, a cavity 631, and a nozzle 651. Among the members, the diaphragm 621 functions as a diaphragm that is provided between the cavity 631 and the piezoelectric element 60, is displaced by driving of the piezoelectric element 60 provided on an upper surface, and enlarges and reduces the internal volume of the cavity 631 filled with the ink. The nozzle 651 is an opening portion which is provided on a nozzle plate 632 and communicates with the cavity 631. The inside of the cavity 631 functions as a pressure chamber which is filled with the ink, and in which the internal volume changes due to the displacement of the piezoelectric element 60. The nozzle 651 communicates with the cavity 631 and discharges the ink in the cavity 631 corresponding to the change in the internal volume of the cavity 631.

The piezoelectric element 60 has a structure in which a piezoelectric body 601 is nipped between one pair of the first electrode 611 and the second electrode 612. The driving signal VOUT is supplied to the first electrode 611, and the reference voltage signal VBS is supplied to the second electrode 612. The piezoelectric element 60 having such a structure is driven corresponding to a potential difference between the first electrode 611 and the second electrode 612. Then, as the piezoelectric element 60 is driven, the center parts of the first electrode 611, the second electrode 612, and the diaphragm 621 are displaced in the up-down direction with respect to both end parts. In addition, the ink is discharged from the nozzle 651 in accordance with the displacement of the diaphragm 621. In other words, the discharge head 21 includes the piezoelectric element 60 driven by the potential difference between the first electrode 611 to which the driving signal COM is supplied and the second electrode to which the reference voltage signal VBS is supplied, and discharges the ink by driving the piezoelectric element 60. Here, the reference voltage signal VBS supplied to the second electrode 612 is an example of the second voltage signal.

Figure 9:
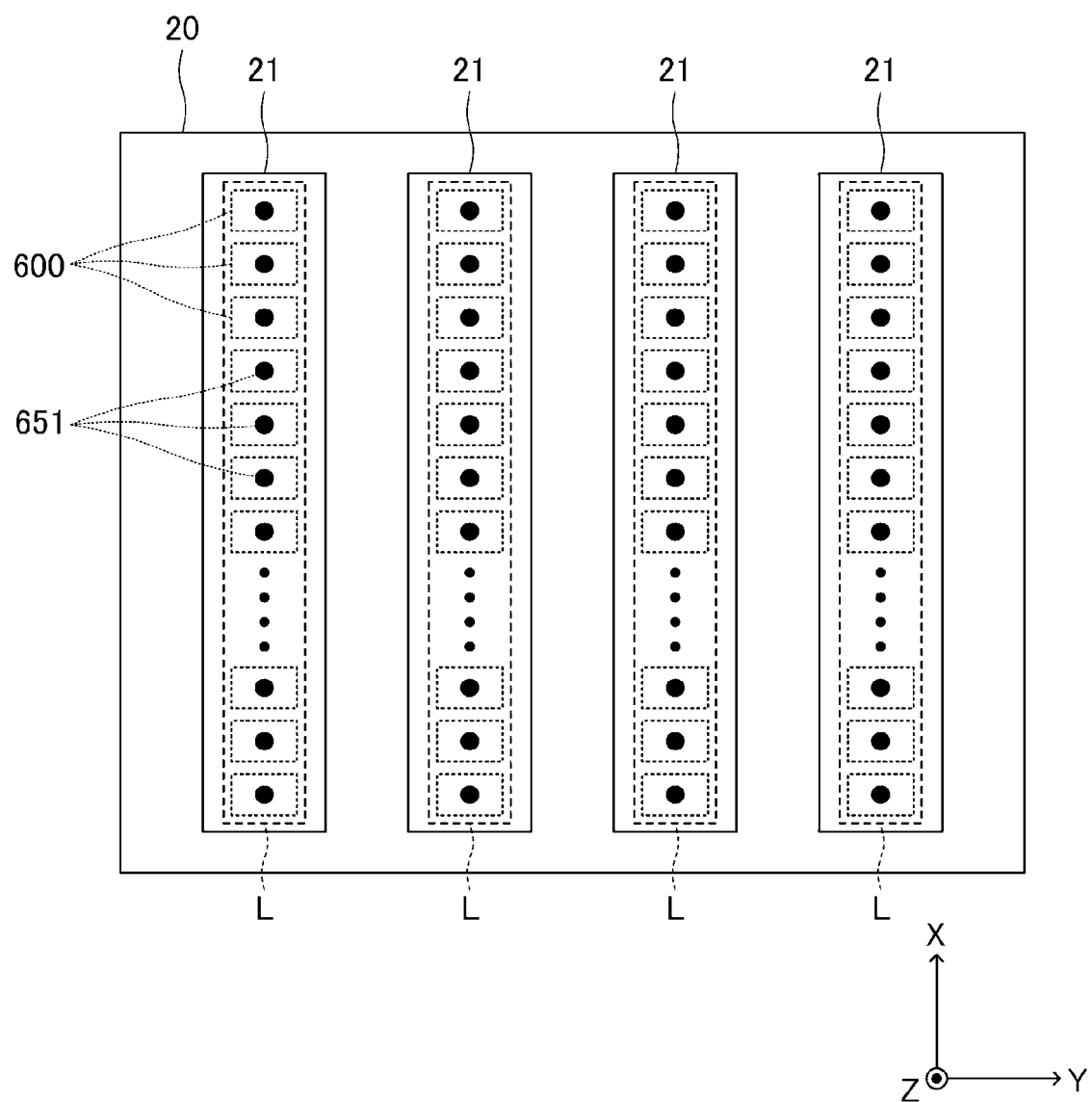
FIG. 9 is a view illustrating an example of disposition of a plurality of nozzles.

FIG. 9 is a view illustrating an example of the disposition of the plurality of nozzles 651 provided on the discharge head 21 when the liquid discharge apparatus 1 is viewed along the direction Z in a plane view. In FIG. 9, the head unit 20 is described as a unit including four discharge heads 21.

As illustrated in FIG. 9, each discharge head 21 is formed with a nozzle row L including the plurality of nozzles 651 provided in a row in a predetermined direction. Each nozzle row L is formed by n nozzles 651 disposed in a row along the direction X. Here, the nozzle row L illustrated in FIG. 9 is an example and may have a different configuration. For example, in each nozzle row L, n nozzles 651 may be disposed in a zigzag manner such that the positions in the direction Y are different in even-numbered nozzles 651 and odd-numbered nozzles 651 counted from the end. In addition, each nozzle row L may be formed in a direction different from the direction X. Further, each discharge head 21 may be formed with the nozzle row L of "2" or more.

Here, in each discharge head 21, the n nozzles 651 that form the nozzle row L are provided at high density of 300 or more per one inch. Therefore, in the discharge head 21, n piezoelectric elements 60 are also provided at high density corresponding to the n nozzles 651. In addition, the piezoelectric body 601 used for the n piezoelectric elements 60 is preferably a thin film having a thickness of, for example, 1 μm or less. Accordingly, the displacement amount of the piezoelectric element 60 with respect to the potential difference between the first electrode 611 and the second electrode 612 can be increased.

Figure 10:
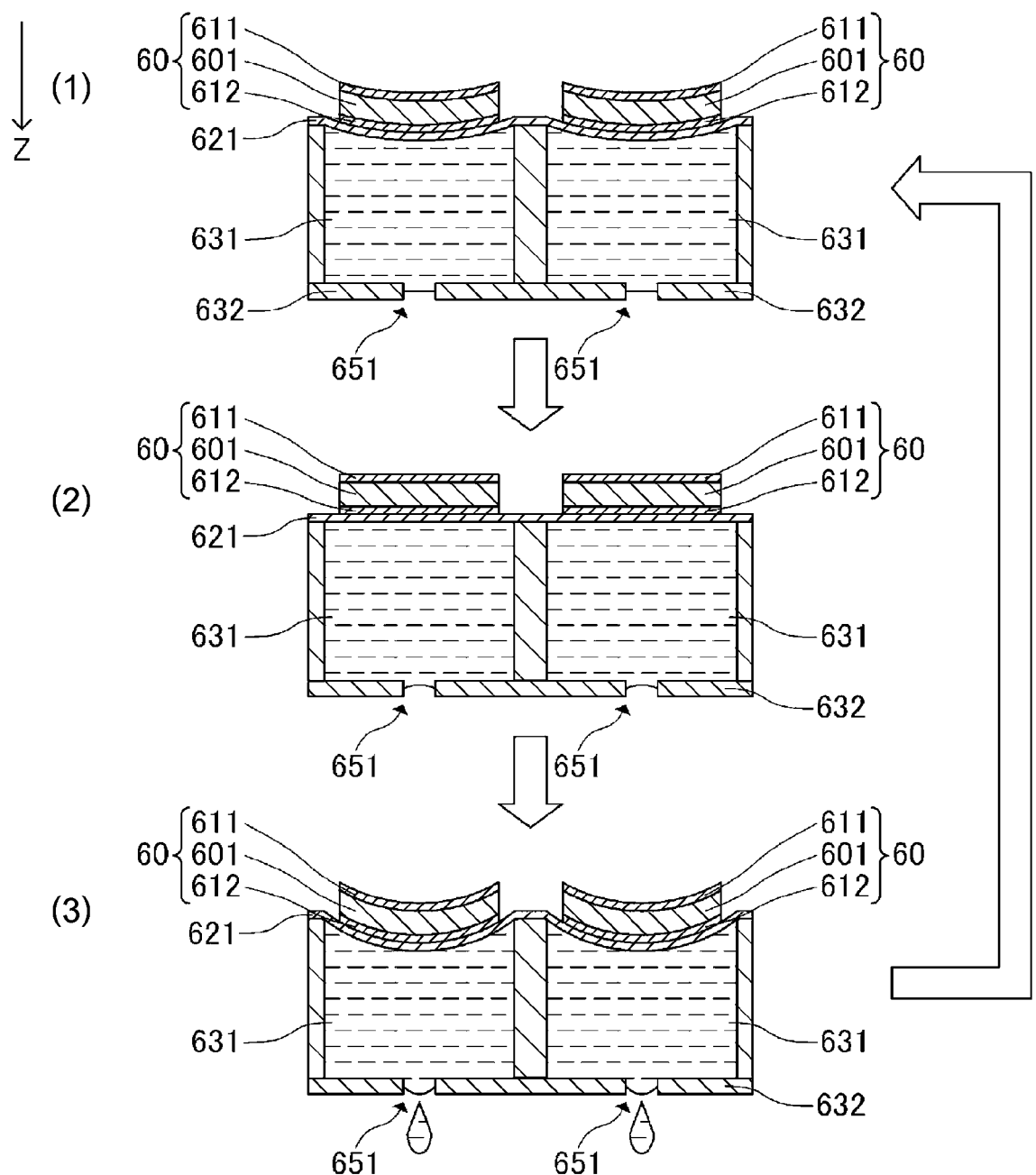
FIG. 10 is a view for describing a relationship between displacement and discharge of a piezoelectric element and a diaphragm.

Next, a discharge operation of the ink discharged from the nozzle 651 will be described using FIG. 10. FIG. 10 is a view for describing a relationship between displacement and discharge of the piezoelectric element 60 and the diaphragm 621 when the driving signal VOUT is supplied to the piezoelectric element 60. In (1) of FIG. 10, the displacement of the piezoelectric element 60 and the diaphragm 621 when the voltage Vc is supplied as the driving signal VOUT is schematically illustrated. Further, in (2) of FIG. 10, the displacement of the piezoelectric element 60 and the diaphragm 621 when the voltage value of the driving signal VOUT supplied to the piezoelectric element 60 is controlled to approach the reference voltage signal VBS from the voltage Vc is schematically illustrated. Further, in (3) of FIG. 10, the displacement of the piezoelectric element 60 and the diaphragm 621 when the voltage value of the driving signal VOUT supplied to the piezoelectric element 60 is controlled to approach the reference voltage signal VBS from the voltage Vc is schematically illustrated.

In the state illustrated in (1) of FIG. 10, the piezoelectric element 60 and the diaphragm 621 are bent in the direction Z corresponding to the potential difference between the driving signal VOUT supplied to the first electrode 611 and the reference voltage signal VBS supplied to the second electrode 612. At this time, the voltage Vc is supplied to the first electrode 611 as the driving signal VOUT. The voltage Vc is a voltage value at the start timing and the end timing of the voltage waveforms Adp, Bdp, and Cdp as described above. In other words, the state of the piezoelectric element 60 and the diaphragm 621 illustrated in (1) of FIG. 10 is a reference state of the piezoelectric element 60 in a state where the liquid discharge apparatus 1 performs printing.

In addition, when the voltage value of the driving signal VOUT is controlled to approach the voltage value of the reference voltage signal VBS, as illustrated in (2) of FIG. 10, the displacement of the piezoelectric element 60 and the diaphragm 621 along the direction Z is reduced. At this time, the internal volume of the cavity 631 expands, and the ink is drawn into the cavity 631 from the reservoir 641.

Thereafter, the voltage value of the driving signal VOUT is controlled to be separated from the voltage value of the reference voltage signal VBS. At this time, as illustrated in (3) of FIG. 10, the displacement of the piezoelectric element 60 and the diaphragm 621 along the direction Z increases. At this time, the internal volume of the cavity 631 is reduced, and the ink filled in the cavity 631 is discharged from the nozzle 651.

In the embodiment, when the discharge head 21 discharges the ink, the piezoelectric element 60 repeats the states (1) to (3) of FIG. 10 by being supplied with the driving signal VOUT. Accordingly, the ink is discharged from the nozzle 651 and dots are formed on the medium P. In addition, the displacements of the piezoelectric element 60 and the diaphragm 621 illustrated in (1) to (3) of FIG. 10 increases along the direction Z as the potential difference between the driving signal VOUT supplied to the first electrode 611 and the reference voltage signal VBS supplied to the second electrode 612 increases. In other words, the discharge head 21 suppresses a discharge amount of the ink discharged from the nozzle 651 corresponding to the potential difference between the driving signal VOUT supplied to the first electrode 611 of the piezoelectric element 60 and the reference voltage signal VBS supplied to the second electrode 612.

In addition, the displacement of the piezoelectric element 60 and the diaphragm 621 relative to the driving signal VOUT illustrated in FIG. 10 is merely an example, and for example, when the potential difference between the driving signal VOUT and the reference voltage signal VBS is large, the ink from the reservoir 641 is drawn into the cavity 631, and when the potential difference between the driving signal VOUT and the reference voltage signal VBS decreases, the ink filled in the cavity 631 may be discharged from the nozzle 651.

Here, since it is difficult to form the piezoelectric body 601 of the piezoelectric element 60 as a single crystal body, the piezoelectric body 601 is formed as a polycrystal which is a collection of ferroelectric microcrystals. At the time of manufacturing, the piezoelectric characteristics of the piezoelectric body 601 do not appear because the directions of the spontaneous polarization of the individual microcrystals are directed in a spontaneous and scattering direction. Here, before the piezoelectric element 60 is incorporated into the discharge head 21, polarization processing is performed to apply a predetermined DC electric field to the piezoelectric body 601 to align the polarization directions. By the polarization processing, the piezoelectric characteristics of the piezoelectric body 601 are realized.

In the embodiment, when the potential of the first electrode 611 of the piezoelectric element 60 is higher than the potential of the second electrode 612, an electric field of the same polarity as that during the polarization processing of the piezoelectric body 601 is applied to the piezoelectric element 60. In addition, when the potential of the first electrode 611 of the piezoelectric element 60 is lower than the potential of the second electrode 612, an electric field of the polarity reverse to that during the polarization processing of the piezoelectric body 601 is applied to the piezoelectric element 60. In the following description, an electric field of the same polarity as that during the polarization processing may be referred to as a same polarity electric field, and an electric field of the polarity opposite to that during the polarization process may be referred to as a reverse polarity electric field.

When the reverse polarity electric field is applied to the piezoelectric element 60, the polarization direction aligned by the polarization processing in the piezoelectric body 601 is disturbed. Since such a disturbance in the polarization direction deteriorates the piezoelectric characteristics, there is a concern that the operation failure of the piezoelectric element 60 is caused. For example, since the piezoelectric body 601 is a polycrystal, partial stress concentration or the like occurs in the manufacturing process or polarization processing process, and the potential micro crack is generated. The application of the reverse polarity electric field to the piezoelectric element 60 not only disturbs the polarization direction of the piezoelectric body 601, but causes the micro crack to grow due to the way of changing the polarization direction being different for each microcrystal, the piezoelectric body 601 may be broken. In particular, in the thin film piezoelectric body 601, the grown crack easily penetrates in the thickness direction. When the crack penetrates in the thickness direction, an electrical short circuit occurs between the first electrode 611 and the second electrode 612, and the function of the piezoelectric element 60 is lost.

In addition, the application of the reverse polarity electric field to the piezoelectric element 60 is permitted in a case of a short time and a low electric field, but when the reverse polarity electric field is applied to the piezoelectric element 60 continuously for a long time, there is a high possibility that the function of the piezoelectric element 60 is lost. Therefore, when the potential of the first electrode 611 of the piezoelectric element 60 becomes lower than the potential of the second electrode 612 at the time of activation of the liquid discharge apparatus 1 or the like, the application of the reverse polarity electric field to the piezoelectric element 60 continues for a long time, and there is a concern that the function of the piezoelectric element 60 is lost.

4. Configuration and Operation of Driving Circuit

Figure 11:
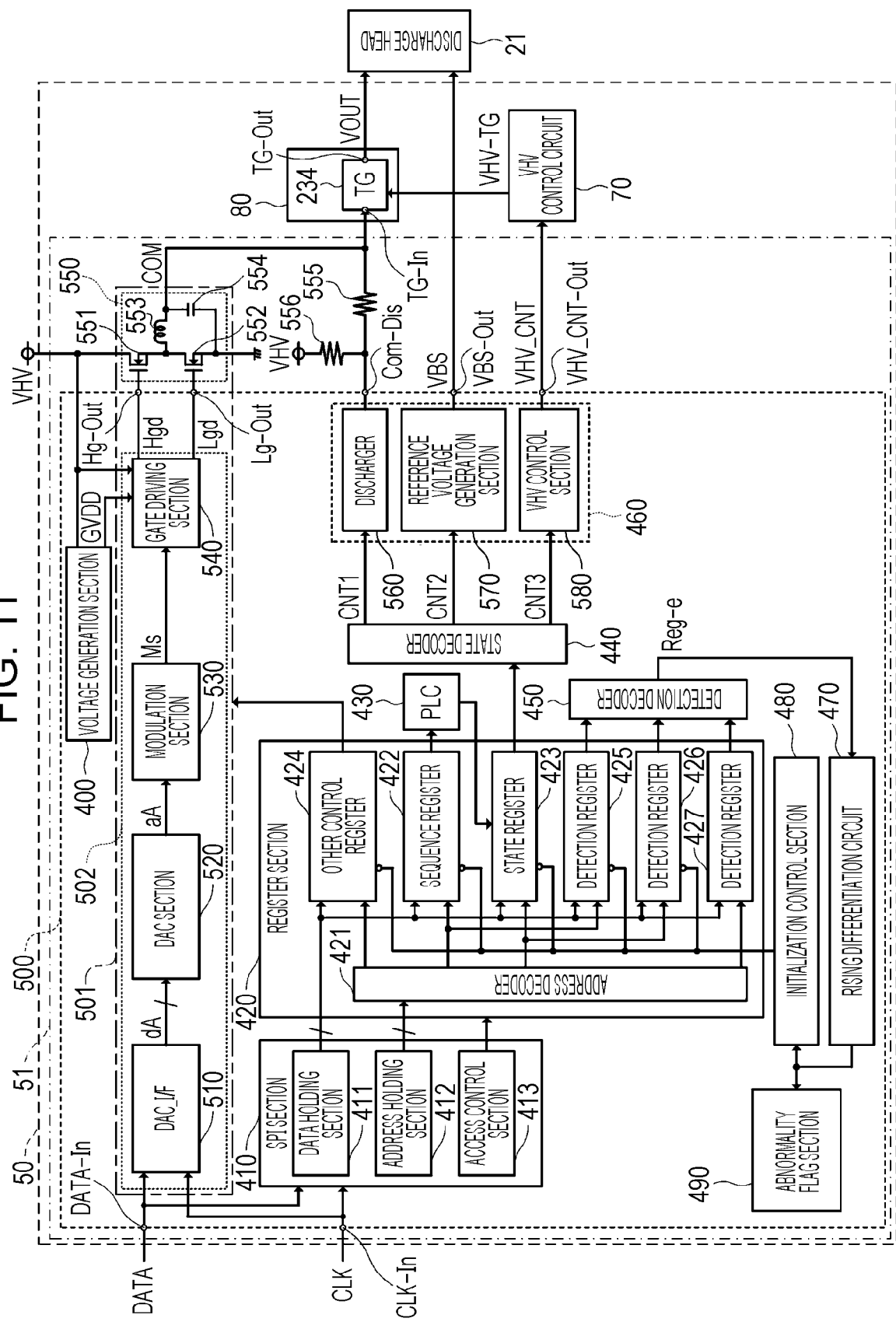
FIG. 11 is a block diagram illustrating a configuration of a driving circuit.

Next, the configuration of the driving circuit 50 will be described. FIG. 11 is a block diagram illustrating the configuration of the driving circuit 50. The driving circuit 50 includes a drive control circuit 51, the VHV control circuit 70, and the driving signal selection control circuit 80. In addition, the drive control circuit 51 also includes an integrated circuit 500, a driving signal output circuit 550, and resistors 555 and 556. Here, the configuration of the driving signal selection control circuit 80 is as described above, and the description thereof will be omitted. Further, FIG. 11 illustrates the transfer gate 234 included in the selection circuit 230 that generates the driving signal VOUT by selecting or deselecting the driving signal COM out of various configurations of the driving signal selection control circuit 80.

The VHV control circuit 70 switches the potential of a voltage VHV-TG supplied to the driving signal selection control circuit 80 to the voltage VHV or to the potential of the ground in accordance with the VHV control signal VHV_CNT.

Figure 12:
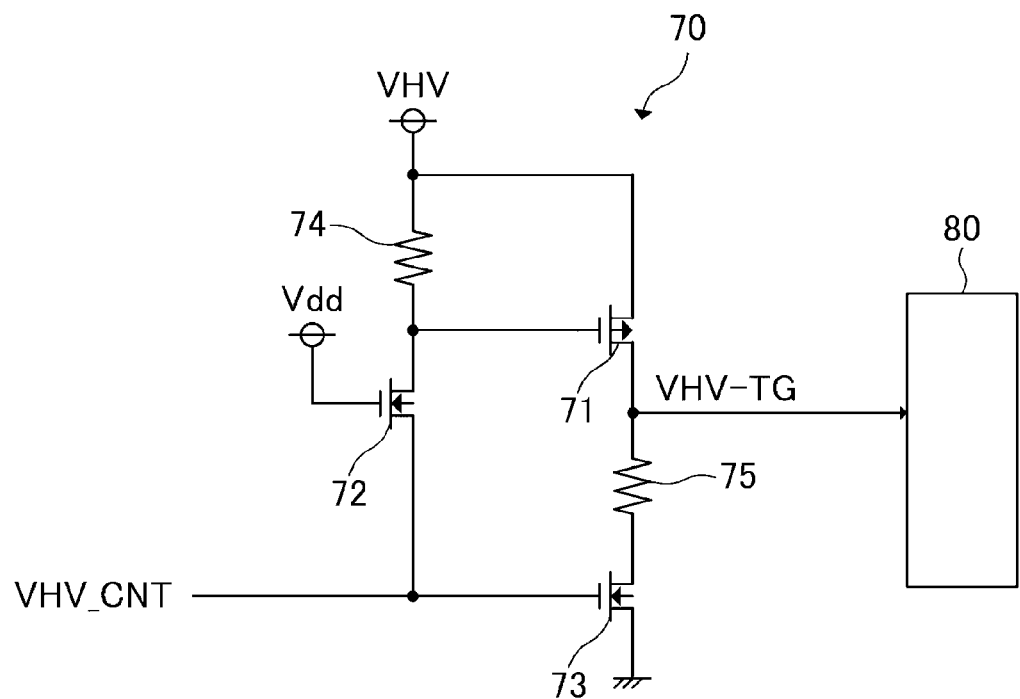
FIG. 12 is a view illustrating an example of a configuration of a VHV control circuit.

FIG. 12 is a view illustrating an example of the configuration of the VHV control circuit 70. As illustrated in FIG.

12, the VHV control circuit 70 includes transistors 71, 72, and 73 and resistors 74 and 75. In the following description, the transistor 71 will be described as the PMOS transistor, and the transistors 72 and 73 will be described as the NMOS transistor.

The source terminal of the transistor 71 is connected to one end of the resistor 74 and is supplied with the voltage VHV. The gate terminal of the transistor 71 is commonly connected to the other end of the resistor 74 and the drain terminal of the transistor 72. The drain terminal of the transistor 71 is connected to one end of the resistor 75. Further, a voltage Vdd is supplied to the gate terminal of the transistor 72. The source terminal of the transistor 72 is connected to the gate terminal of the transistor 73 and is supplied with the VHV control signal VHV_CNT. In addition, the drain terminal of the transistor 73 is connected to the other end of the resistor 75. The source terminal of the transistor 73 is connected to the ground. Here, the voltage Vdd is a DC voltage signal of any voltage value.

The VHV control circuit 70 configured as described above supplies the voltage VHV as the voltage VHV-TG to the driving signal selection control circuit 80 in accordance with the VHV control signal VHV_CNT, or switches the supply of the potential of the ground as the voltage VHV-TG to the driving signal selection control circuit 80. In other words, the VHV control circuit 70 controls the voltage VHV-TG supplied to the driving signal selection control circuit 80 and the transfer gate 234.

Specifically, when the VHV control signal VHV_CNT of L level is input, the transistor 73 is controlled to be turned off, and the transistor 72 is controlled to be turned on. Accordingly, the signal of L level is input into the gate terminal of the transistor 71 via the transistor 72. Therefore, the transistor 71 is controlled to be turned on. As a result, the voltage VHV supplied via the transistor 71 is supplied as the voltage VHV-TG to the driving signal selection control circuit 80 and the transfer gate 234.

Meanwhile, when the VHV control signal VHV_CNT of H level is input, the transistor 73 is controlled to be turned on. At this time, the voltage VHV is supplied to the drain terminal of the transistor 72 and the gate terminal of the transistor 71 via the resistor 74. Therefore, the transistor 71 is controlled to be turned off. As a result, the driving signal selection control circuit 80 is connected to the ground via the resistor 75 and the transistor 72. In other words, to the driving signal selection control circuit 80, the potential of the ground is supplied to the driving signal selection control circuit 80 and the transfer gate 234 as the voltage VHV-TG via the resistor 75 and the transistor 72. Here, the voltage VHV-TG is an example of a power source voltage of the transfer gate 234.

Returning to FIG. 11, the integrated circuit 500 includes an amplification control signal generation circuit 502, a voltage generation section 400, a serial peripheral interface (SPI) section 410, a register section 420, a programmable logic controller (PLC) 430, a state decoder 440, a detection decoder 450, an output control section 460, a rising differentiation circuit 470, an initialization control section 480, and an abnormality flag section 490.

The voltage generation section 400 generates a voltage GVDD based on the voltage VHV. The voltage GVDD is input into various configurations of the integrated circuit 500 including a gate driving section 540 which will be described later.

The amplification control signal generation circuit 502 generates amplification control signals Hgd and Lgd based on the data signal that defines the signal waveform of the driving signal COM included in the drive data signal DATA input from a terminal DATA-In. The amplification control signal generation circuit 502 includes a DAC interface (DAC_I/F: digital to analog converter interface) 510, a DAC section 520, a modulation section 530, and the gate driving section 540. Here, a data signal that defines the signal waveform of the driving signal COM included in the drive data signal DATA input into the amplification control signal generation circuit 502 is an example of drive data, and the terminal DATA-In is an example of the input terminal.

The DAC interface 510 receives the drive data signal DATA supplied from the terminal DATA-In and the clock signal CLK supplied from the terminal CLK-In. The DAC interface 510 integrates the drive data signal DATA based on the clock signal CLK, and generates, for example, 10-bit drive data dA that defines the waveform of the driving signal COM. The drive data dA is input into the DAC section 520. The DAC section 520 converts the input drive data dA into a base driving signal aA of an analog signal. The base driving signal aA is a target signal before amplification of the driving signal COM. The base driving signal aA is input into the modulation section 530. The modulation section 530 outputs a modulating signal Ms in which pulse width modulation is applied to the base driving signal aA. The voltages VHV and GVDD and the modulating signal Ms are input into the gate driving section 540. The gate driving section 540 amplifies the input modulating signal Ms based on the voltage GVDD, and generates the amplification control signal Hgd level-shifted to a high amplitude logic based on the voltage VHV and the amplification control signal Lgd amplified based on the voltage GVDD by inverting the logic level of the input modulating signal Ms. In other words, the logic levels of both the amplification control signal Hgd and the amplification control signal Lgd are exclusive to each other. The amplification control signal Hgd is output from the integrated circuit 500 via a terminal Hg-Out, and is input into the driving signal output circuit 550. Similarly, the amplification control signal Lgd is output from the integrated circuit 500 via a terminal Lg-Out, and is input into the driving signal output circuit 550.

The driving signal output circuit 550 outputs the driving signal COM by operating based on the amplification control signals Hgd and Lgd. The driving signal output circuit 550 includes transistors 551 and 552, a coil 553, and a capacitor 554. In addition, each of the transistors 551 and 552 is, for example, an N-channel type field effect transistor (FET). Here, the driving signal output circuit 550 is an example of a first voltage signal output circuit.

The drain terminal of the transistor 551 is supplied with the voltage VHV. The amplification control signal Hgd is supplied to the gate terminal of the transistor 551 via the terminal Hg-Out. The source terminal of the transistor 551 is electrically connected to the drain terminal of the transistor 552. Further, the amplification control signal Lgd is supplied to the gate terminal of the transistor 552 via the terminal Lg-Out. The source electrode of the transistor 552 is connected to the ground. The transistor 551 connected as described above operates corresponding to the amplification control signal Hgd, and the transistor 552 operates corresponding to the amplification control signal Lgd. In other words, the transistor 551 and the transistor 552 are exclusively turned on. Accordingly, at a connection point between the source terminal of the transistor 551 and the drain terminal of the transistor 552, an amplifying modulating signal is generated by amplifying the modulating signal Ms based on the voltage VHV. In other words, the transistor 551 and the transistor 552 function as an amplifier circuit.

One end of the coil 553 is commonly connected to the source terminal of the transistor 551 and the drain terminal of the transistor 552. In addition, the other end of the coil 553 is connected to one end of the capacitor 554. The other end of the capacitor 554 is connected to the ground. In other words, the coil 553 and the capacitor 554 configure a low pass filter. In addition, by supplying an amplifying modulating signal to the low pass filter, the amplifying modulating signal is demodulated and the driving signal COM is generated. The driving signal COM generated by the driving signal output circuit 550 is input into the terminal TG-In which is one end of the transfer gate 234.

Here, the configuration including the amplification control signal generation circuit 502 and the driving signal output circuit 550 which are included in the integrated circuit 500 is referred to as a driving signal generation circuit 501 that generates the driving signal COM based on the drive data signal DATA.

Returning to the description of the integrated circuit 500, the SPI section 410 includes a data holding section 411, an address holding section 412, and an access control section 413. The SPI section 410 receives the drive data signal DATA supplied from the terminal DATA-In and the clock signal CLK supplied from the terminal CLK-In. The drive data signal DATA input into the SPI section 410 includes a data signal held by a plurality of registers included in the register section 420 (will be described later), an address signal indicating an address of a register to hold the data signal, and an access control signal that controls access to the register section 420.

The data holding section 411 holds the data signal held by the plurality of registers, in the drive data signal DATA. In addition, the address holding section 412 holds the address signal of the drive data signal DATA. The access control section 413 outputs the data signal held by the data holding section 411 and the address signal held by the address holding section 412 to the register section 420 based on the access control signal of the drive data signal DATA.

Here, the drive data signal DATA supplied from the terminal DATA-In and the clock signal CLK supplied from the terminal CLK-In are switched to, for example, a signal to be input into the SPI section 410 by a multiplexer and a select signal (not illustrated), or to the signal to be input into the amplification control signal generation circuit 502. In addition, the drive data signal DATA supplied from the terminal DATA-In and the clock signal CLK supplied from the terminal CLK-In may be switched to the signal to be input into the SPI section 410 or to the signal to be input into the amplification control signal generation circuit 502, based on data included in a specific bit of the drive data signal DATA.

The register section 420 includes an address decoder 421, a sequence register 422, a state register 423, detection registers 425, 426, and 427, and other control registers 424. The address signal held by the address holding section 412 is input into the address decoder 421. Then, the address decoder 421 outputs a write control signal indicating whether to hold the data signal held by the data holding section 411 by any of the sequence register 422, the state register 423, the detection registers 425, 426, and 427, and the other control register 424.

The sequence register 422 and the state register 423 hold the data signals that define the operating state of the driving circuit 50 input from the terminal DATA-In. Specifically, the sequence register 422 holds a data signal indicating the start of the sequence control of the driving circuit 50 by the PLC 430 (will be described later), among the drive data signals DATA input from the terminal DATA-In. Here, as the data signal indicating the start held by the sequence register 422, a data signal indicating a transition destination to which a state transition is to be made, or the like, can be employed.

Among the drive data signals DATA input from the terminal DATA-In, the state register 423 holds the data signal indicating the current operating state of the driving circuit 50 when it is determined that the control circuit 100 needs special control regardless of the sequence control by the PLC 430. Further, the state register 423 holds a data signal indicating an initial operating state of the driving circuit 50 when the power source of the liquid discharge apparatus 1 is turned on, among the drive data signals DATA input from the terminal DATA-In. Furthermore, the state register 423 holds a data signal indicating the current operating state transitioned by the sequence control by the PLC 430. In other words, the state register 423 holds the data signal indicating the current operating state of the driving circuit 50.

Here, at least one of the sequence register 422 and the state register 423 is an example of the first register, and the data signal indicating the start of sequence control of the driving circuit 50 held by the sequence register 422 and the data signal indicating the current operating state of the driving circuit 50 held by the state register 423, are an example of the operating state data.

Based on the write control signal, the other control register 424 holds various types of data signals other than the data signal for starting the sequence control of the driving circuit 50 described above and the data signal indicating the current operating state of the driving circuit 50. For example, based on the data signal input as the drive data signal DATA, the data signal indicating the start of the sequence control, the data signal indicating the current operating state of the driving circuit 50, and the like, the other control register 424 may hold a data signal for controlling the voltage value of the driving signal COM generated in the driving signal generation circuit 501. In addition, the other control register 424 may include a plurality of registers assigned to a plurality of addresses.

The detection registers 425, 426, and 427 hold the data signal of a predetermined code for determining whether or not various data signals held by the sequence register 422, the state register 423, and the other control registers 424 are normal, based on the write control signal.

Specifically, the detection register 425 holds the data signal of the predetermined code for determining the presence or absence of the abnormality of the data signal held by the sequence register 422. In addition, the detection register 425 is provided at the same address as the sequence register 422. As described above, the sequence register 422 holds the data signal indicating the start of the sequence control of the liquid discharge apparatus 1. Therefore, when an abnormality occurs in the data signal held by the sequence register 422, there is a concern that the liquid discharge apparatus 1 performs an unintended sequence operation, and as a result, there is a concern about deterioration of the ink discharge accuracy and the print quality and failure of the liquid discharge apparatus 1. By providing the detection register 425 and the sequence register 422 at the same address, based on whether or not the data signal held by the detection register 425 is a predetermined code, it is possible to determine the presence or absence of the abnormality of the data signal held by the sequence register 422. Accordingly, it is possible to increase the detection accuracy of the presence or absence of the abnormality of the data signal held by the sequence register 422 which is one of the important data signals. Here, the detection register 425 provided at the same address as the sequence register 422 is an example of a second register, and the data signal having a predetermined code held by the detection register 425 is an example of abnormality detection data.

The detection register 426 holds the data signal of the predetermined code for determining the presence or absence of the abnormality of the data signal held by the state register 423. In addition, the detection register 426 is provided at the same address as the state register 423. The state register 423 holds the data signal indicating the current operating state in the sequence control of the liquid discharge apparatus 1. Therefore, when the abnormality occurs in the data signal held by the state register 423, there is a concern that the liquid discharge apparatus 1 is controlled by an operation different from the actual operating state, and as a result, there is a concern about deterioration of the ink discharge accuracy and the print quality and failure of the liquid discharge apparatus 1. By providing the detection register 426 and the state register 423 at the same address, based on whether or not the data signal held by the detection register 426 is a predetermined code, it is possible to determine the presence or absence of the abnormality of the data signal held by the state register 423. Accordingly, it is possible to detect the presence or absence of the abnormality of the data signal held by the state register 423 which is one of the important data signals with high accuracy. Here, the detection register 426 provided at the same address as the state register 423 is another example of the second register, and the data signal having a predetermined code held by the detection register 426 is another example of the abnormality detection data.

The detection register 427 is provided at any address. When the liquid discharge apparatus 1 and the driving circuit 50 operate in an environment susceptible to disturbance noise, the data signal of the predetermined code held by the detection register 427 is rewritten by the influence of the disturbance noise. In other words, based on whether or not the data signal held by the detection register 427 is a predetermined code, it is possible to detect whether or not the data signal held by a register included in the other control register 424 is normal. In addition, a plurality of detection registers 427 may be provided in the register section 420, and may be provided at the same address as any of the other control registers 424.

The detection decoder 450 detects whether or not the data signal held by each of the detection registers 425, 426, and 427 is a predetermined code. Then, when any of the data signals held by each of the detection registers 425, 426, and 427 is different from the predetermined code, the detection decoder 450 outputs an abnormality detection signal Reg-e of H level indicating the data signals held by the detection registers 425, 426, and 427 are abnormal.

The rising differentiation circuit 470 detects the rising of the abnormality detection signal Reg-e, and outputs a signal indicating that the abnormality occurs in the data signal held by the detection registers 425, 426, and 427 in the initialization control section 480 and the abnormality flag section 490. When an abnormality of the data signal held by the detection registers 425, 426, and 427 is detected, the initialization control section 480 initializes the data signal held by the sequence register 422, the state register 423, the other control register 424, and the detection registers 425, 426, and 427. In addition, when an abnormality of the data signal held by the detection registers 425, 426, and 427 is detected, in the abnormality flag section 490, an abnormality flag indicating that an abnormality has occurred in the driving circuit 50 stands. Then, the driving circuit 50 generates the error signal ERR illustrated in FIG. 2 based on the abnormality flag, and outputs the generated error signal ERR to the control circuit 100.

The PLC 430 executes the sequence control of the driving circuit 50 based on the data signal held by the sequence register 422. In addition, a data signal that corresponds to the current operating state is output to the state register 423. Specifically, the sequence register 422 holds the data signal indicating the transition destination to which a state transition is to be made. The PLC 430 executes predetermined sequence control with respect to the transition destination to be transitioned held by the sequence register 422 from the current operating state.

The state decoder 440 generates control signals CNT1, CNT2, and CNT3 based on the data signal held by the state register 423, and outputs the generated control signals to the output control section 460. Here, the output control section 460 includes a discharger 560, a reference voltage generation section 570, and a VHV control section 580. The control signal CNT1 is input into the discharger 560 included in the output control section 460. The discharger 560 controls whether to supply the driving signal COM to the terminal TG-In of the transfer gate 234 based on the control signal CNT1. Further, the control signal CNT2 is input into the reference voltage generation section 570. The reference voltage generation section 570 controls the output of the reference voltage signal VBS based on the control signal CNT2. Further, the control signal CNT3 is input into the VHV control section 580. The VHV control section 580 outputs the VHV control signal VHV_CNT of the logic level based on the control signal CNT3.

5. Configuration and Operation of Output Control Section 460

Here, based on the data signal held by at least one of the sequence register 422 and the state register 423, control of the output of the driving circuit 50 in the output control section 460 by the control signals CNT1, CNT2, and CNT3 output from the state decoder 440 will be described. Here, the output control section 460 is an example of the output control circuit.

Figure 13:
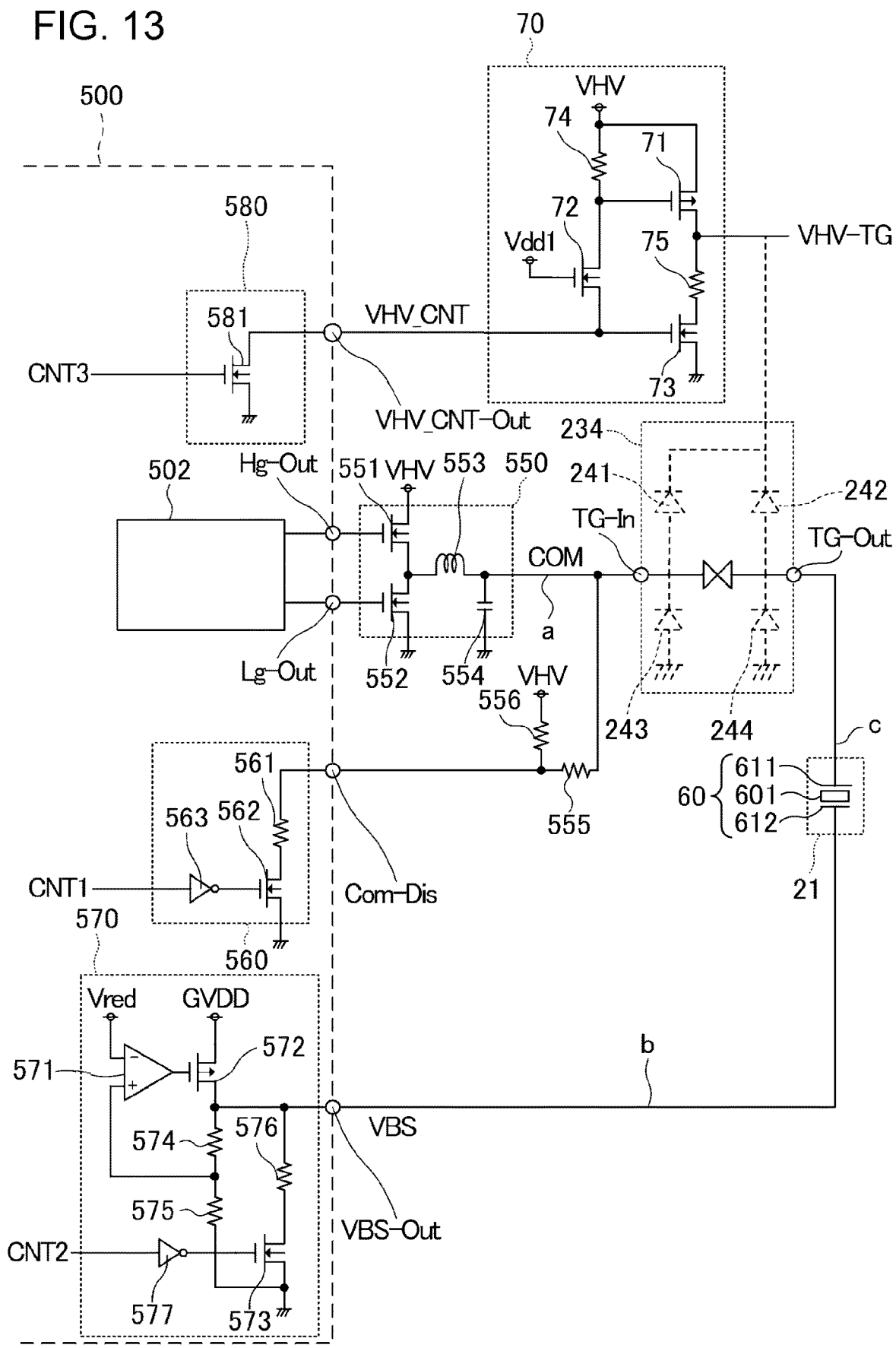
FIG. 13 is a view for describing an operation of an output control section.

FIG. 13 is a view for describing the operation of the output control section 460 based on the control signals CNT1, CNT2, and CNT3. In addition, diodes 241, 242, 243, and 244 illustrated by broken lines in FIG. 13 indicate parasitic diodes formed in the transfer gate 234.

The discharger 560 controls the supply of the driving signal VOUT to the piezoelectric element 60 by controlling whether to supply the driving signal COM to the terminal TG-In of the transfer gate 234 based on the control signal CNT1. In other words, the discharger 560 included in the integrated circuit 500 controls the supply of the driving signal COM to the piezoelectric element 60 based on the data signal held by at least one of the sequence register 422 and the state register 423.

Specifically, the discharger 560 includes a resistor 561, a transistor 562 which is an NMOS transistor, and an inverter 563. One end of the resistor 561 is electrically connected to a terminal Com-Dis of the integrated circuit 500 and the terminal TG-In of the transfer gate 234 via the resistor 555. Further, the other end of the resistor 561 is electrically connected to the drain terminal of the transistor 562. The source terminal of the transistor 562 is connected to the ground. Further, the control signal CNT1 is input into the gate terminal of the transistor 562 via the inverter 563.

When the control signal CNT1 of H level is input into the discharger 560, the drain terminal and the source terminal of the transistor 562 are controlled to be nonconductive. Therefore, the path via the resistors 555 and 561 and the transistor 562 electrically connecting the terminal TG-In of the transfer gate 234 supplied with the driving signal COM to the ground is controlled to high impedance. As a result, the driving signal COM is supplied to the terminal TG-In of the transfer gate 234. Meanwhile, when the control signal CNT1 of L level is input into the discharger 560, the drain terminal and the source terminal of the transistor 562 are controlled to be conductive. Therefore, the terminal TG-In of the transfer gate 234 is electrically connected to the ground via the resistors 555 and 561. As a result, the voltage value of the driving signal COM supplied to the terminal TG-In of the transfer gate 234 is controlled to the potential of the ground via the resistors 555 and 561.

As described above, the discharger 560 controls whether to supply the driving signal COM to the terminal TG-In of the transfer gate 234 by switching connection and disconnection of a node a to which the driving signal COM is supplied to ground based on the control signal CNT1.

The reference voltage generation section 570 controls the output of the reference voltage signal VBS based on the control signal CNT2. In other words, the reference voltage generation section 570 included in the integrated circuit 500 controls the supply of the reference voltage signal VBS to the second electrode 612 based on the data signal held by at least one of the sequence register 422 and the state register 423.

The reference voltage generation section 570 includes a comparator 571, transistors 572 and 573, resistors 574, 575, and 576, and an inverter 577. In the following description, a transistor 452 will be described as the PMOS transistor, and a transistor 453 will be described as the NMOS transistor.

A reference voltage Vref is supplied to an input end (−) of the comparator 571. Further, an input end (+) of the comparator 571 is commonly connected to one end of the resistor 574 and one end of the resistor 575. An output end of the comparator 571 is connected to the gate terminal of the transistor 572. The voltage GVDD is supplied to the source terminal of the transistor 572. The drain terminal of the transistor 572 is commonly connected to the other end of the resistor 574, one end of the resistor 576, and a terminal VBS-Out from which the reference voltage signal VBS is output. The other end of the resistor 576 is connected to the drain terminal of the transistor 573. The control signal CNT2 is input into the gate terminal of the transistor 573 via the inverter 577. The source terminal of the transistor 573, and the other end of the resistor 575 are connected to the ground.

In the reference voltage generation section 570 configured as described above, when the voltage supplied to the input end (+) of the comparator 571 is larger than the reference voltage Vref supplied to the input end (−) of the comparator 571, the comparator 571 outputs a signal of H level. At this time, the transistor 572 is controlled to be turned off. Therefore, the voltage GVDD is not supplied to the terminal VBS-Out. Meanwhile, when the voltage supplied to the input end (+) of the comparator 571 is smaller than the reference voltage Vref supplied to the input end (−) of the comparator 571, the comparator 571 outputs a signal of L level. At this time, the transistor 572 is controlled to be turned on. Therefore, the voltage GVDD is supplied to the terminal VBS-Out. In other words, the reference voltage generation section 570 generates the reference voltage signal VBS of a constant voltage value based on the voltage GVDD by operating the comparator 571 such that the voltage value obtained by dividing the reference voltage signal VBS by the resistors 574 and 575 becomes equal to the reference voltage Vref.

When the control signal CNT2 of H level is input into the reference voltage generation section 570, the transistor 573 is controlled to be nonconductive. Therefore, the path via the resistor 576 and the transistor 573 electrically connecting the terminal VBS-Out to the ground is controlled to high impedance. As a result, the reference voltage signal VBS is output from the terminal VBS-Out. Meanwhile, when the control signal CNT2 of L level is input into the reference voltage generation section 570, the transistor 573 is controlled to be conductive. As a result, the terminal VBS-Out is electrically connected to the ground via the resistor 576. As a result, the reference voltage signal VBS is not supplied to the second electrode 612 of the piezoelectric element 60.

As described above, the reference voltage generation section 570 controls whether to supply the reference voltage signal VBS to the second electrode 612 of the piezoelectric element 60 by switching connection and disconnection of a node b to which the reference voltage signal VBS is supplied is connected to ground based on the control signal CNT2.

The VHV control section 580 generates the VHV control signal VHV_CNT for controlling switching the potential of the voltage VHV-TG to be the VHV or to be the potential of the ground in the VHV control circuit 70. In other words, the VHV control section 580 included in the integrated circuit 500 controls the supply of the voltage VHV-TG to the transfer gate 234 based on the data signal held by at least one of the sequence register 422 and the state register 423.

The VHV control section 580 includes a transistor 581. Here, the transistor 581 will be described as the NMOS transistor. The control signal CNT3 is input into the gate terminal of the transistor 581. The drain terminal of the transistor 581 is electrically connected to the gate terminal of the transistor 73 of the VHV control circuit 70 via a terminal VHV_CNT-Out of the integrated circuit 500. The source terminal of the transistor 581 is connected to the ground.

When the control signal CNT3 of H level is input into the VHV control section 580, the transistor 581 is controlled to be conductive. Therefore, the VHV control section 580 outputs the VHV control signal VHV_CNT of L level. As a result, the above-described voltage VHV is supplied as the voltage VHV-TG to the driving signal selection control circuit 80 and the transfer gate 234. Meanwhile, when the control signal CNT3 of L level is input into the VHV control section 580, the transistor 581 is controlled to be nonconductive. Therefore, the VHV control section 580 outputs the VHV control signal VHV_CNT of H level. As a result, the potential of the above-described ground is supplied as the voltage VHV-TG to the driving signal selection control circuit 80 and the transfer gate 234.

Figure 14:
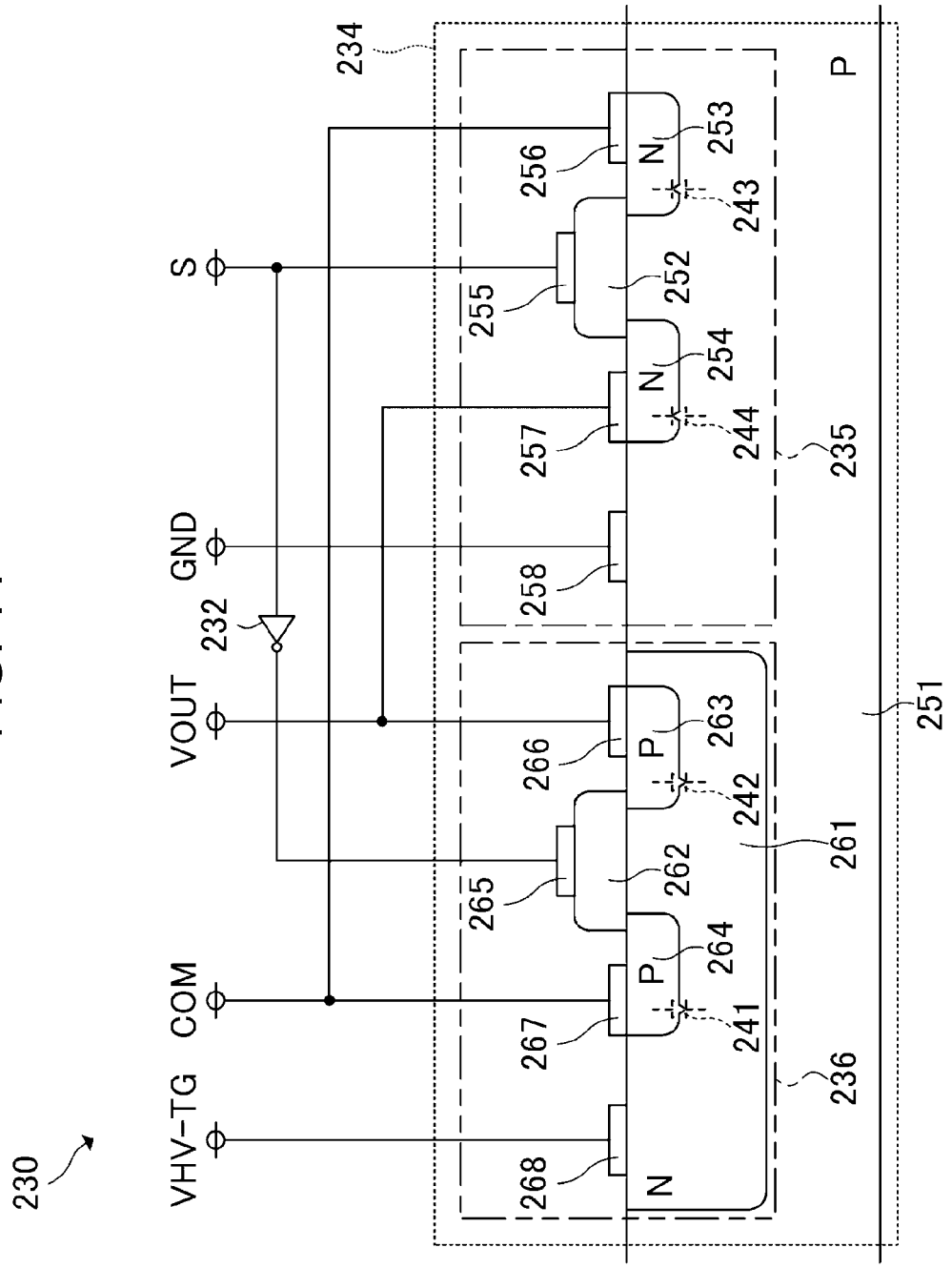
FIG. 14 is a sectional view schematically illustrating a transistor that configures a transfer gate.

Here, the parasitic diode generated in the transfer gate 234 will be described with reference to FIG. 14. FIG. 14 is a sectional view schematically illustrating the transistors 235 and 236 that configure the transfer gate 234.

As illustrated in FIG. 14, the transistor 235 includes polysilicon 252, N-type diffusion layers 253 and 254, and a plurality of electrodes. The N-type diffusion layers 253 and 254 are formed to be separated from each other on a P substrate 251. In addition, the polysilicon 252 is formed between the N-type diffusion layer 253 and the N-type diffusion layer 254 via an insulating layer (not illustrated). Further, an electrode 255 is formed on the polysilicon 252, an electrode 256 is formed on the N-type diffusion layer 253, and an electrode 257 is formed on the N-type diffusion layer 254. Here, the electrode 255 functions as a gate terminal of the transistor 235, one of the electrodes 256 and 257 functions as a drain terminal of the transistor 235, and the other functions as a source terminal of the transistor 235. In the following description, the electrode 256 is described as a drain terminal, and the electrode 257 is described as a source terminal.

In the transistor 235 configured as described above, a PN junction is formed on each of a contact surface between the P substrate 251 and the N-type diffusion layer 253 and a contact surface between the P substrate 251 and the N-type diffusion layer 254. Therefore, in the transistor 235, a diode 243 having the P substrate 251 as an anode and the N-type diffusion layer 253 as a cathode, and a diode 244 having the P substrate 251 as an anode and the N-type diffusion layer 254 as a cathode are formed.

Further, an electrode 258 is formed on the P substrate 251. Since the transistor 235 is formed on the P substrate 251, the electrode 258 functions as a back gate terminal of the transistor 235. Here, the electrode 258 is connected to the ground. Therefore, the anode terminals of the diodes 243 and 244 are commonly connected to the ground.

The transistor 236 includes an N well 261, polysilicon 262, P-type diffusion layers 263 and 264, and a plurality of electrodes. The P-type diffusion layers 263 and 264 are formed to be separated from each other on the N well 261 formed on the P substrate 251. In addition, the polysilicon 262 is formed between the P-type diffusion layer 263 and the P-type diffusion layer 264 via an insulating layer (not illustrated). An electrode 265 is formed on the polysilicon 262. In addition, an electrode 266 is formed on the P-type diffusion layer 263. Further, an electrode 267 is formed on the P-type diffusion layer 264. Here, the electrode 265 functions as a gate terminal of the transistor 236, any one of the electrodes 266 and 267 functions as a drain terminal of the transistor 236, and the other one functions as a source terminal of the transistor 236. In the following description, the electrode 266 is described as a drain terminal, and the electrode 267 is described as a source terminal.

In the transistor 236 configured as described above, a PN junction is formed on each of a contact surface between the N well 261 and the P-type diffusion layer 263 and a contact surface between the N well 261 and the P-type diffusion layer 264. Therefore, in the transistor 236, a diode 242 having the P-type diffusion layer 263 as the anode and the N well 261 as the cathode, and a diode 241 having the P-type diffusion layer 264 as the anode and the N well 261 as the cathode terminal are formed.

Further, an electrode 268 is formed on the N well 261. Since the transistor 236 is formed on the N well 261, the electrode 268 functions as a back gate terminal of the transistor 236. In addition, the voltage VHV-TG is supplied to the electrode 268. Therefore, the voltage VHV-TG is commonly supplied to the cathode terminals of the diodes 241 and 242.

Returning to FIG. 13, the VHV control circuit 70 supplies the voltage VHV as the voltage VHV-TG to the driving signal selection control circuit 80 and the transfer gate 234 when the VHV control signal VHV_CNT of L level is output. Therefore, the potential of the anode terminal of the diode 242 is smaller than the potential of the cathode terminal. In other words, the diode 242 is controlled to high impedance. Therefore, the charge stored in a node c is held by the node c. Meanwhile, the VHV control circuit 70 supplies the potential of the ground to the driving signal selection control circuit 80 and the transfer gate 234 as the voltage VHV-TG when the VHV control signal VHV_CNT of H level is output. Therefore, the potential at the anode terminal of the diode 242 is larger than the potential of the cathode terminal. As a result, the charge stored in the node c is released to the ground via the diode 242.

As described above, the VHV control section 580 holds the charge stored in the node c by controlling the supply of the voltage VHV-TG to the driving signal selection control circuit 80 including the transfer gate 234 based on the control signal CNT3, or controls the release.

6. Sequence Control of Liquid Discharge Apparatus and Driving Circuit

Figure 15:
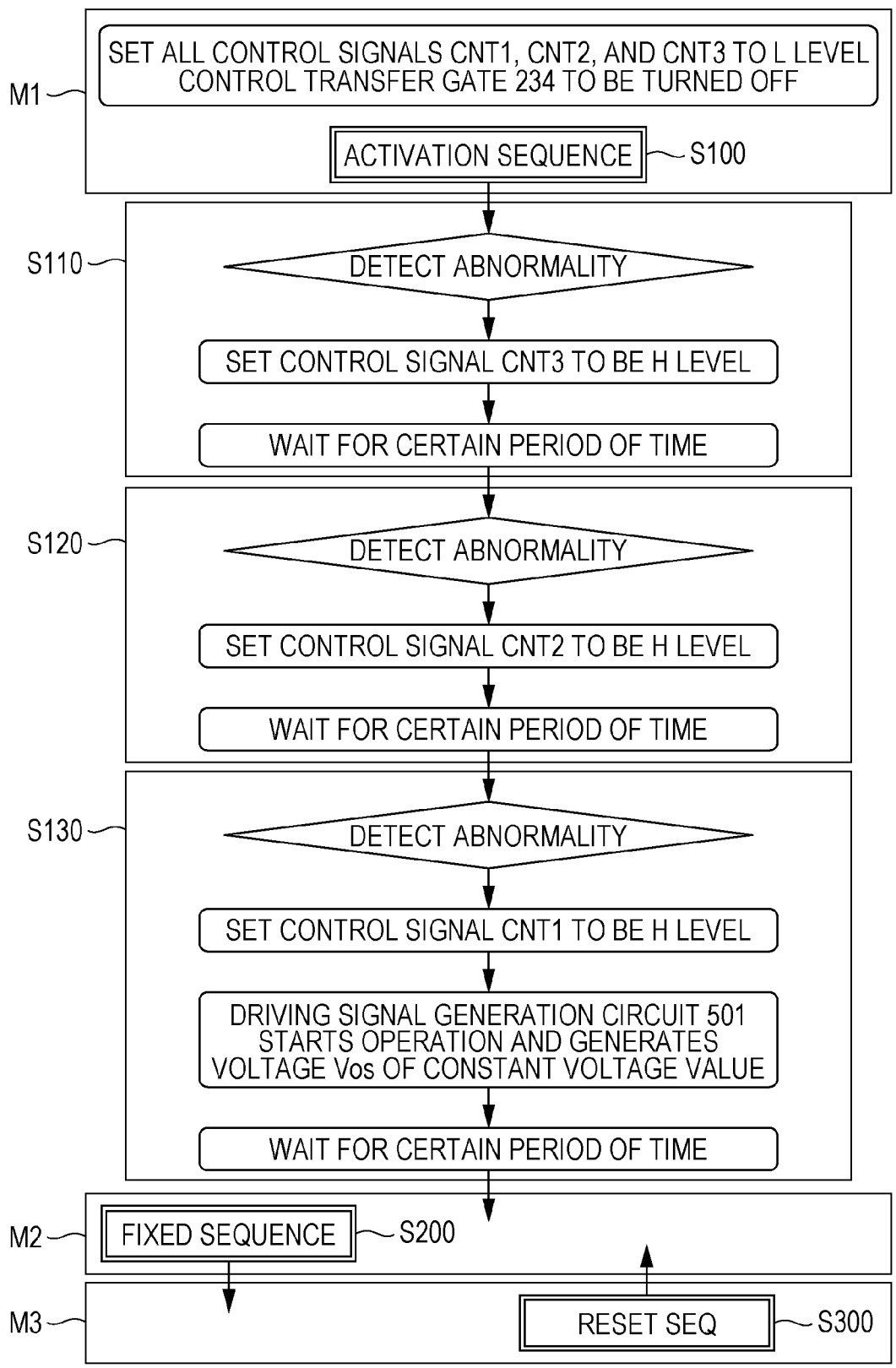
FIG. 15 is a state transition diagram for describing sequence control at activation of the driving circuit.

In the driving circuit 50 configured as described above, the PLC 430 executes sequence control based on the data signal held by the sequence register 422 as described above. Here, the sequence control of the driving circuit 50 will be described. FIG. 15 is a state transition diagram for describing the sequence control at activation of the driving circuit 50.

When the power source of the liquid discharge apparatus 1 is turned on, the sequence register 422 holds the data signal for causing transition to a sleep mode M1. Then, the PLC 430 causes the driving circuit 50 to transition to the sleep mode, and causes the state register 423 to hold the data signal indicating the sleep mode M1.

The state decoder 440 sets each of the control signals CNT1, CNT2, and CNT3 to L level based on the data signal held by the state register 423. Accordingly, the charges of both the first electrode 611 and the second electrode 612 of the piezoelectric element 60 are released, and the first electrode 611 and the second electrode 612 commonly have the potential of the ground. In other words, the potentials of the first electrode 611 and the second electrode 612 are substantially equal to each other. In addition, immediately after the power source of the liquid discharge apparatus 1 is turned on, the data signal held by the state register 423 may be a data signal in which the data signal supplied from the control circuit 100 as the drive data signal DATA is held based on the write control signal. Here, the control circuit 100 controls the transfer gate 234 to be turned off in the sleep mode M1.

When the drive data signal DATA for transitioning the state to a driving mode M2 for driving the piezoelectric element 60 is supplied from the control circuit 100, a data signal based on the drive data signal DATA is held by the sequence register 422. Then, the PLC 430 executes an activation sequence S100.

By executing the activation sequence S100, the PLC 430 causes the operating state of the driving circuit 50 to transition to a state S110, and causes the state register 423 to hold the data signal indicating the state S110.

In the state S110, the driving circuit 50 confirms whether or not the data signals held by the detection registers 425, 426 and 427 and the operations of each part of the driving circuit 50 are normal, based on the output of the detection decoder 450. Thereafter, the state decoder 440 sets the control signal CNT3 to be H level based on the data signal held by the state register 423. Accordingly, the supply of the voltage VHV-TG to the driving signal selection control circuit 80 is started, and the node c illustrated in FIG. 13 is controlled to high impedance. Then, the PLC 430 waits in the state S110 for a certain period of time.

After waiting for a certain period of time in the state S110, the PLC 430 causes the operating state of the driving circuit 50 to transition to a state S120, and causes the state register 423 to hold the data signal indicating the state S120.

In the state S120, the driving circuit 50 confirms whether or not the data signals held by the detection registers 425, 426 and 427 and the operations of each part of the driving circuit 50 are normal, based on the output of the detection decoder 450. Thereafter, the state decoder 440 sets the control signal CNT2 to be H level based on the data signal held by the state register 423. Accordingly, generation of the reference voltage signal VBS is started. In other words, after the voltage VHV is supplied to the transfer gate 234 as the voltage VHV-TG, the reference voltage generation section 570 starts generation of the reference voltage signal VBS. At this time, since the transfer gate 234 is controlled to be turned off and the node c illustrated in FIG. 13 is controlled to be high impedance, the potential of the first electrode 611 also increases in accordance with the supply of the reference voltage signal VBS to the second electrode 612 of the piezoelectric element 60. Therefore, the potentials of the first electrode 611 and the second electrode 612 of the piezoelectric element 60 rise in a substantially equal state. Accordingly, the concern that the reverse polarity electric field is applied to the piezoelectric element 60 is reduced, and the concern that an unintended displacement occurs in the piezoelectric element 60 is reduced. Then, the PLC 430 waits in the state S120 for a certain period of time.

After waiting for a certain period of time in the state S120, the PLC 430 causes the operating state of the driving circuit 50 to transition to a state S130, and causes the state register 423 to hold the data signal indicating the state S120.

In the state S130, the driving circuit 50 confirms whether or not the data signals held by the detection registers 425, 426 and 427 and the operations of each part of the driving circuit 50 are normal, based on the output of the detection decoder 450. Thereafter, the state decoder 440 sets the control signal CNT1 to be H level based on the data signal held by the state register 423. Accordingly, the discharge of the node a illustrated in FIG. 13 is stopped. Then, the driving signal generation circuit 501 starts operating. In other words, after the voltage VHV is supplied to the transfer gate 234 as the voltage VHV-TG, the driving signal generation circuit 501 starts output of the driving signal COM. At this time, the driving signal generation circuit 501 generates a voltage Vos of a constant voltage value as the driving signal COM based on the data signal held by the other control register 424. Here, the voltage Vos is set to the same voltage value as a set voltage value of the reference voltage signal VBS. In other words, the voltage value of driving signal COM is controlled to approach the voltage value of the reference voltage signal VBS in the state S130. Then, the PLC 430 waits in the state S130 for a certain period of time.

After waiting for a certain period of time in the state S130, the PLC 430 causes the operating state of the driving circuit 50 to transition to the driving mode M2, and causes the state register 423 to hold the data signal indicating the driving mode M2. After the transition to the driving mode M2, the control circuit 100 controls the transfer gate 234 to be turned on. At this time, voltage Vos having a constant voltage value of the potential equivalent to that of reference voltage signal VBS is supplied as the driving signal COM to the terminal TG-In side of transfer gate 234, and the voltage of the same potential as that of the reference voltage signal VBS is supplied to terminal TG-Out side of transfer gate 234. Therefore, even immediately after the transfer gate 234 is controlled to be turned on, the concern that the reverse polarity electric field is generated between the first electrode 611 and the second electrode 612 of the piezoelectric element 60 is reduced. Then, the driving signal generation circuit 501 controls the voltage value of the driving signal COM to the voltage Vc based on the drive data signal DATA input from the control circuit 100. Thereafter, the control circuit 100 controls the transfer gate 234 to be turned off. Accordingly, the piezoelectric element 60 is held in the state illustrated in (1) of FIG. 10.

In addition, the driving circuit 50 is in a standby state where the piezoelectric element 60 is not driven, and has a fixed output mode M3 that can transition to the driving mode M2 during a short period of time compared to the sleep mode M1 when image data is supplied from the host computer. In the driving mode M2, when the drive data signal DATA for causing a state to transition to the fixed output mode M3 is supplied from the control circuit 100 to the driving circuit 50, the data signal based on the drive data signal DATA is held by the sequence register 422. Then, the PLC 430 executes a fixed sequence S200. Accordingly, the driving circuit 50 transitions to the fixed output mode M3. In the fixed output mode M3, the driving signal generation circuit 501 stops the operation, and a signal of a constant voltage generated in the voltage generation circuit (not illustrated) is supplied to the node a. Accordingly, it is possible to achieve both reduction in power consumption due to the switching operation of the driving signal generation circuit 501 and transition to the driving mode M2 during a short period of time.

In addition, in the fixed output mode M3, when the drive data signal DATA for causing a state to transition to the driving mode M2 is supplied from the control circuit 100 to the driving circuit 50, the data signal based on the drive data signal DATA is held by the sequence register 422. Then, the PLC 430 executes a reset sequence S300. Accordingly, the driving signal generation circuit 501 starts operating, and the operating state of the driving circuit 50 transitions to the driving mode M2.

Figure 16:
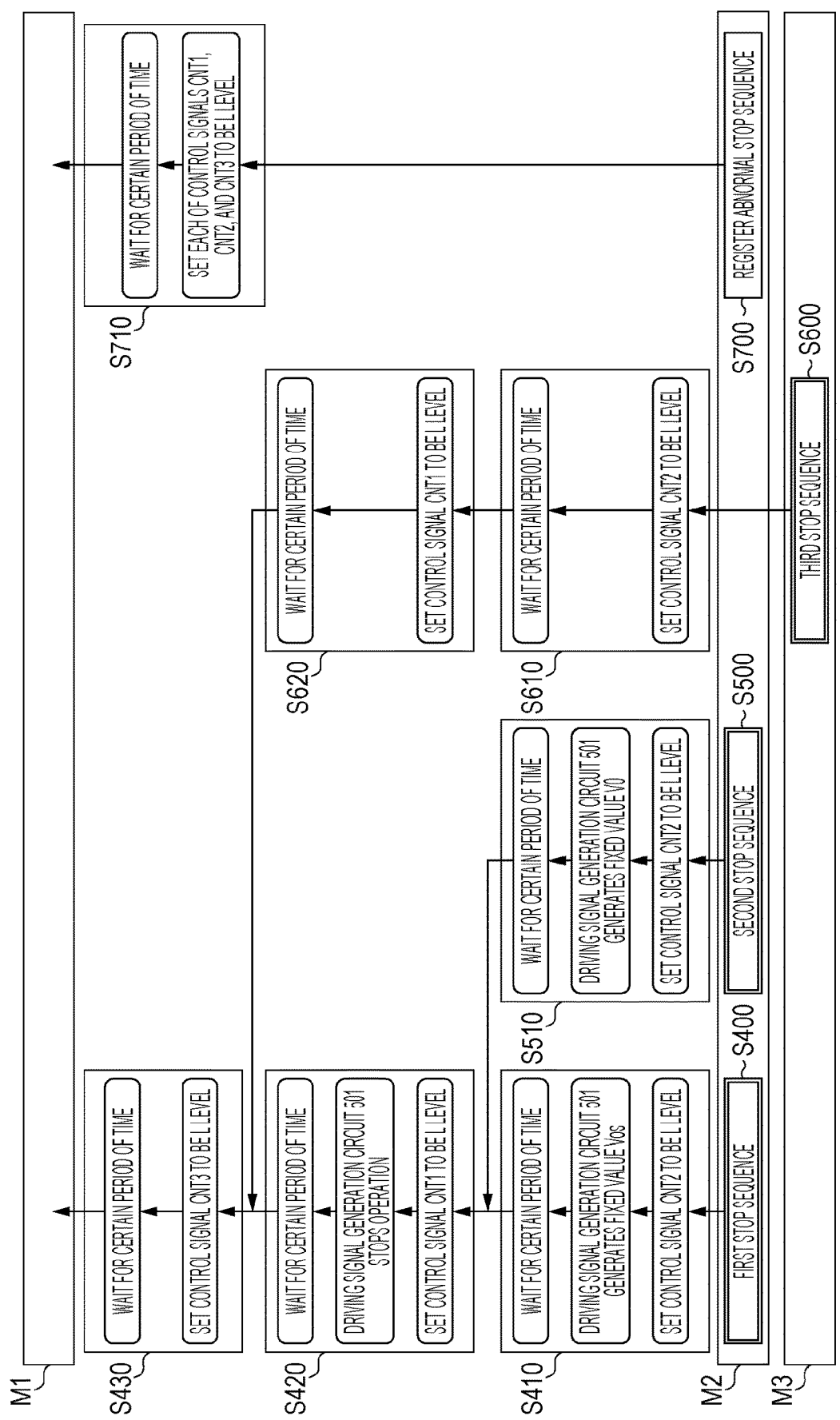
FIG. 16 is a state transition diagram for describing sequence control at operation stop of the driving circuit.

Next, the sequence control at operation stop of the driving circuit 50 will be described. FIG. 16 is a state transition diagram for describing the sequence control at operation stop of the driving circuit 50. As illustrated in FIG. 16, the driving circuit 50 has a first stop sequence S400, a second stop sequence S500, a third stop sequence S600, and a register abnormal stop sequence S700.

The first stop sequence S400 causes the operating state of the driving circuit 50 to transition from the driving mode M2 to the sleep mode M1 in a normal operation. Specifically, in the driving mode M2, when the drive data signal DATA for causing a state to transition to the sleep mode M1 is supplied from the control circuit 100, the data signal based on the drive data signal DATA is held by the sequence register 422, and the PLC 430 executes the first stop sequence S400.

By executing the first stop sequence S400, the PLC 430 causes the operating state of the driving circuit 50 to transition to a state S410, and causes the state register 423 to hold the data signal indicating the state S410. The state decoder 440 sets the control signal CNT2 to be L level based on the data signal held by the state register 423. Accordingly, the supply of the reference voltage signal VBS to the piezoelectric element 60 is stopped. Therefore, the charge stored in the second electrode 612 of the piezoelectric element 60 is released, and the concern that the reverse polarity electric field is applied to the piezoelectric element 60 is reduced at operation stop of the driving circuit 50. In addition, in the state S410, the driving signal generation circuit 501 generates the voltage Vos as the driving signal COM based on the data signal held by the other control register 424. Then, the PLC 430 causes the operating state of the driving circuit 50 to wait in the state S410 for a certain period of time.

After waiting for a certain period of time in the state S410, the PLC 430 causes the operating state of the driving circuit 50 to transition to a state S420, and causes the state register 423 to hold the data signal indicating the state S420. The state decoder 440 sets the control signal CNT1 to be L level based on the data signal held by the state register 423. Accordingly, the charge stored in the node a illustrated in FIG. 13 is released. In addition, in the state S410, the driving signal generation circuit 501 stops the operation. Then, the PLC 430 causes the operating state of the driving circuit 50 to wait in the state S420 for a certain period of time. Accordingly, both the first electrode 611 and the second electrode 612 of the piezoelectric element 60 have the potential of the ground. Therefore, the concern that the reverse polarity electric field is applied to the piezoelectric element 60, and the concern that an unintended displacement occurs in the piezoelectric element 60 are reduced.

After waiting for a certain period of time in the state S420, the PLC 430 causes the operating state of the driving circuit 50 to transition to a state S430, and causes the state register 423 to hold the data signal indicating the state S430. The state decoder 440 sets the control signal CNT3 to be L level based on the data signal held by the state register 423. Accordingly, the charge stored in the node c illustrated in FIG. 13 is released to the ground via the diode 242. Then, the PLC 430 causes the operating state of the driving circuit 50 to wait in the state S420 for a certain period of time.

After waiting for a certain period of time in the state S430, the PLC 430 causes the operating state of the driving circuit 50 to transition to the sleep mode M1, and causes the state register 423 to hold the data signal indicating the sleep mode M1. After the transition to the sleep mode M1, the control circuit 100 controls the transfer gate 234 to be turned off. In other words, in the sleep mode M1, a state where the potential of the ground is supplied to both the first electrode 611 and the second electrode 612 of the piezoelectric element 60, is held. Accordingly, it is possible to reduce the concern about an unintended displacement of the piezoelectric element 60 due to the application of an unintended voltage to the first electrode 611 and the second electrode 612 of the piezoelectric element 60 in the sleep mode M1.

The second stop sequence S500 causes the operating state of the driving circuit 50 to transition from the driving mode M2 to the sleep mode M1 when an operation abnormality of the driving circuit 50, such as a fuse blowout due to an overcurrent, occurs. Specifically, in the driving mode M2, due to the occurrence of the operation abnormality of the driving circuit 50, when the drive data signal DATA for causing a state to transition to the sleep mode M1 is supplied from the control circuit 100 to the driving circuit 50, the data signal based on the drive data signal DATA is held by the sequence register 422, and the PLC 430 executes the second stop sequence S500.

By executing the second stop sequence S500, the PLC 430 causes the operating state of the driving circuit 50 to transition to a state S510, and causes the state register 423 to hold the data signal indicating the state S510. The state decoder 440 sets the control signal CNT2 to be L level based on the data signal held by the state register 423. Accordingly, the supply of the reference voltage signal VBS to the piezoelectric element 60 is stopped. Therefore, the concern that the reverse polarity electric field is applied to the piezoelectric element 60 is reduced at operation stop of the driving circuit 50. In addition, in the state S510, the driving signal generation circuit 501 generates a voltage V0 of the potential of the ground as the driving signal COM. Then, the PLC 430 causes the operating state of the driving circuit 50 to wait in the state S510 for a certain period of time.

After waiting for a certain period of time in the state S510, the PLC 430 causes the operating state of the driving circuit 50 to transition to the state S420, and causes the state register 423 to hold the data signal indicating the state S420. Thereafter, in the driving circuit 50, similar to the first stop sequence, the operating state transitions to the state S420, the state S430, and the sleep mode M1. The second stop sequence S500 described above is executed when the operation abnormality of the driving circuit 50, such as a fuse blowout due to an overcurrent, occurs. By setting the driving signal COM generated by the driving signal generation circuit 501 to the voltage V0 of the potential of the ground in the state S510, the influence of the operation abnormality can be reduced.

The third stop sequence S600 causes the operating state of the driving circuit 50 to transition from the fixed output mode M3 to the sleep mode M1. Specifically, in the fixed output mode M3, when the drive data signal DATA for causing a state to transition to the sleep mode M1 is supplied from the control circuit 100, the data signal based on the drive data signal DATA is held by the sequence register 422, and the PLC 430 executes the third stop sequence S600.

By executing the third stop sequence S600, the PLC 430 causes the operating state of the driving circuit 50 to transition to the state S510, and causes the state register 423 to hold the data signal indicating the state S510. The state decoder 440 sets the control signal CNT2 to be L level based on the data signal held by the state register 423. Accordingly, the supply of the reference voltage signal VBS to the piezoelectric element 60 is stopped. Then, the PLC 430 causes the operating state of the driving circuit 50 to wait in the state S610 for a certain period of time.

After waiting for a certain period of time in the state S610, the PLC 430 causes the operating state of the driving circuit 50 to transition to a state S620, and causes the state register 423 to hold the data signal indicating the state S620. The state decoder 440 sets the control signal CNT1 to be L level based on the data signal held by the state register 423. Then, the PLC 430 causes the operating state of the driving circuit 50 to wait in the state S620 for a certain period of time.

After waiting for a certain period of time in the state S620, the PLC 430 causes the operating state of the driving circuit 50 to transition to the state S430, and causes the state register 423 to hold the data signal indicating the state S430. Thereafter, in the driving circuit 50, similar to the first stop sequence, the operating state transitions to the state S430 and the sleep mode M1. As described above, since the driving signal generation circuit 501 stops the operation in the fixed output mode M3, from the viewpoint that the operation stop or the like of the driving signal generation circuit 501 is not included, the third stop sequence S600 is different from the first stop sequence S400 and the second stop sequence S500. Further, in the third stop sequence S600, since the driving signal generation circuit 501 stops the operation in the fixed output mode M3, even when the operation abnormality of the driving circuit 50, such as a fuse blowout due to an overcurrent, occurs in the fixed output mode M3, similar sequence control may be performed.

The register abnormal stop sequence S700 causes the operating state of the driving circuit 50 to transition to the sleep mode M1 when the detection decoder 450 detects the abnormality of the data signal held by any of the control registers including the sequence register 422 and the state register 423. Specifically, in the driving mode M2, when it is determined that any data signal held by the detection registers 425, 426, and 427 is abnormal based on the output of detection decoder 450, the initialization control section 480 initializes the data signal held by the sequence register 422, the state register 423, the other control register 424, and the detection registers 425, 426, and 427. In addition, the signal held by the sequence register 422 is initialized, and accordingly the PLC 430 executes the register abnormal stop sequence S700.

By executing the register abnormal stop sequence S700, the PLC 430 causes the operating state of the driving circuit 50 to transition to a state S710, and causes the state register 423 to hold the data signal indicating the state S510. The state decoder 440 sets the control signals CNT1, CNT2, and CNT3 to L level based on the data signal held by the state register 423. Accordingly, the charges stored in the node a and the node c are released, and the generation of the reference voltage signal VBS is stopped. Then, after causing the operating state of the driving circuit 50 to wait in the state S710 for a certain period of time, the PLC 430 causes the state to transition to the sleep mode M1.

Here, in the state S710, the control signals CNT1, CNT2, and CNT3 are all set to L level based on the data signal held by the state register 423, but the VHV control signal VHV_CNT generated based on the control signal CNT3 is preferably generated with a certain period of delay after the control signal CNT3 transitions to L level in the VHV control section 580. When the voltage VHV-TG supplied to the transfer gate 234 becomes the potential of the ground before the reference voltage signal VBS, there is a concern that a reverse polarity electric field is generated in the piezoelectric element 60. By generating the VHV control signal VHV_CNT with a certain period of delay after the control signal CNT3 transitions to L level, the concern that the voltage VHV-TG becomes the potential of the ground before the reference voltage signal VBS is reduced, and as a result, the concern that the reverse polarity electric field is generated in the piezoelectric element 60 is reduced.

7. Operational Effect

As described above, in the liquid discharge apparatus 1 according to the embodiment, the driving circuit 50 that drives the discharge head 21 controls the output of the driving circuit by controlling the output of the output control section 460 based on the data signal held by at least one of the sequence register 422 and the state register 423 included in the integrated circuit 500. Accordingly, the operating state of the driving circuit 50 is controlled. In this case, the data signal held by at least one of the sequence register 422 and the state register 423 includes the amplification control signal generation circuit 502 and the driving signal output circuit 550, and is input into the driving circuit 50 from the terminal DATA-in together with the drive data signal DATA input into the driving signal generation circuit 501 that generates the driving signal COM. Therefore, in the integrated circuit 500, in order to control the operation of the driving circuit 50, it is not necessary to provide a terminal for inputting a command signal to the integrated circuit, and as a result, the concern that the size of the integrated circuit increases is reduced.

In the liquid discharge apparatus 1 according to the embodiment, the driving circuit 50 that drives the discharge head 21 includes the detection register 425 provided at the same address as the sequence register 422 and the detection register 426 provided at the same address as the state register 423. The detection register 425 holds the data signal for detecting the presence or absence of the abnormality of the data signal held by the sequence register 422, and the detection register 426 holds the data signal for detecting the presence or absence of the abnormality in the data signal held by the state register 423. The data signals held by the sequence register 422 and the state register 423 are data signals that define the operating state of the driving circuit 50, and by detecting the presence or absence of such an abnormality in the data signal using the data signal held by the detection registers 425 and 426 provided at the same address, it is possible to improve the detection accuracy of the presence or absence of the abnormality of the data signal held by the sequence register 422 and the state register 423.

8. Modification Example

The above-described liquid discharge apparatus 1 has been described as a serial type ink jet printer in which the medium P is transported, the carriage 24 on which the discharge head 21 is mounted reciprocates intersecting with the transport direction of the medium P, and accordingly the ink is discharged to the medium P to perform the printing, but a line type ink jet printer in which the nozzle row L formed by the plurality of nozzles 651 in the discharge head 21 are formed with a sufficient length in the width direction of the medium P, the medium P is transported on the lower side in the ink discharge direction of the nozzle row L, and accordingly, the ink is discharged to the medium P to perform the printing, may be employed.

In addition, the driving signal generation circuit 501 provided in the above-described liquid discharge apparatus 1 has been described as the D class amplifier circuit that amplifies the modulating signal Ms in which pulse width modulation is applied to the base driving signal aA, and thereafter, generates the driving signal COM by demodulating, but a configuration that amplifies the base driving signal aA by A class amplification, B class amplification, AB class amplification or the like, and generates the driving signal COM may be employed.

Above, the embodiments and the modification examples have been described above, but the disclosure is not limited to the embodiments, and can be implemented in various modes without departing from the gist thereof. For example, the above-described embodiments can also be appropriately combined with each other.

The disclosure includes substantially the same configuration as the configuration described in the embodiment (for example, a configuration having the same function, method, and result, or a configuration having the same object and effect. Further, the disclosure includes a configuration in which non-essential parts of the configuration described in the embodiments are replaced. In addition, the disclosure includes a configuration that achieves the same operation and effect as the configuration described in the embodiment, or a configuration that can achieve the same object. Further, the disclosure includes a configuration in which a known technology is added to the configuration described in the embodiment.

What is claimed is:

1. A driving circuit that drives a discharge head which includes a piezoelectric element driven by receiving a first voltage signal and which discharges a liquid by driving the piezoelectric element, the driving circuit comprising:

a first voltage signal output circuit that outputs the first voltage signal by operating based on an amplification control signal; and
an integrated circuit that outputs the amplification control signal, wherein
the integrated circuit includes
an amplification control signal generation circuit,
an output control circuit, and
a first register,
the amplification control signal generation circuit generates the amplification control signal based on a drive data that defines a signal waveform of the first voltage signal input from an input terminal,
the first register holds an operating state data that defines the operating state of the driving circuit input from the input terminal,
the output control circuit controls an output of the driving circuit based on the operating state data,
the integrated circuit includes a second register that holds an abnormality detection data for determining the presence or absence of an abnormality in the operating state data held by the first register, and
the second register is provided at the same address as the first register.

2. The driving circuit according to claim 1, wherein the integrated circuit controls the supply of the first voltage signal to the piezoelectric element based on the operating state data held by the first register.

3. The driving circuit according to claim 1, further comprising:
a switch circuit of which one end is supplied with the first voltage signal and the other end is electrically connected to the piezoelectric element, wherein
the integrated circuit controls supply of power source voltage to the switch circuit based on the operating state data held by the first register.

4. The driving circuit according to claim 1, wherein the piezoelectric element is driven by a potential difference between a first electrode to which the first voltage signal is supplied and a second electrode to which a second voltage signal is supplied, and
the integrated circuit controls the supply of the second voltage signal to the second electrode based on the operating state data held by the first register.

5. An integrated circuit including a driving circuit that drives a discharge head which includes a piezoelectric element driven by receiving a first voltage signal and which discharges a liquid by driving the piezoelectric element, the integrated circuit comprising:
an amplification control signal generation circuit;
an output control circuit; and
a first register, wherein
the amplification control signal generation circuit generates an amplification control signal which is a basis of the first voltage signal based on a drive data that defines a signal waveform of the first voltage signal input from an input terminal,
the first register holds an operating state data input from the input terminal,
the output control circuit controls an output of the driving circuit based on the operating state data,
the integrated circuit includes a second register that holds an abnormality detection data for determining the presence or absence of an abnormality in the operating state data held by the first register, and
the second register is provided at the same address as the first register.

6. A liquid discharge apparatus comprising:
a discharge head that includes a piezoelectric element driven by receiving a first voltage signal and that discharges a liquid by driving the piezoelectric element; and
a driving circuit for driving the discharge head, wherein the driving circuit includes
a first voltage signal output circuit that outputs the first voltage signal by operating based on an amplification control signal, and
an integrated circuit that outputs the amplification control signal,
the integrated circuit includes
an amplification control signal generation circuit,
an output control circuit, and
a first register,
the amplification control signal generation circuit generates the amplification control signal based on a drive data that defines a signal waveform of the first voltage signal input from an input terminal,
the first register holds an operating state data that defines the operating state of the driving circuit input from the input terminal,
the output control circuit controls an output of the driving circuit based on the operating state data,
the integrated circuit includes a second register that holds an abnormality detection data for determining the presence or absence of an abnormality in the operating state data held by the first register, and
the second register is provided at the same address as the first register.

* * * * *